(12) United States Patent
Förster et al.

(10) Patent No.: US 6,455,369 B1
(45) Date of Patent: Sep. 24, 2002

(54) METHOD FOR FABRICATING A TRENCH CAPACITOR

(75) Inventors: Matthias Förster; Jörn Lützen, both of Dresden; Martin Gutsche, Dorfen; Anja Morgenschweis, Dresden, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/932,902

(22) Filed: Aug. 20, 2001

(30) Foreign Application Priority Data

Aug. 18, 2000 (DE) .......................................... 100 40 464

(51) Int. Cl.⁷ .......................................... H01L 21/8242
(52) U.S. Cl. ....................... 438/249; 438/243; 438/244; 438/246; 438/386; 438/387; 438/389; 438/392; 438/964; 257/301
(58) Field of Search ................................ 438/243–249, 438/386–392, 964; 257/301

(56) References Cited

U.S. PATENT DOCUMENTS

| | | | | |
|---|---|---|---|---|
| 4,906,590 A | * | 3/1990 | Kanetaki et al. ............. | 257/304 |
| 5,191,509 A | * | 3/1993 | Wen ............................. | 257/304 |
| 5,258,332 A | * | 11/1993 | Horioka et al. .............. | 438/389 |
| 5,877,061 A | | 3/1999 | Halle et al. | |
| 6,020,609 A | * | 2/2000 | Wu ............................. | 257/296 |
| 6,159,874 A | * | 12/2000 | Tews et al. .................. | 438/243 |
| 6,177,696 B1 | * | 1/2001 | Bronner et al. ............. | 257/301 |
| 6,200,873 B1 | * | 3/2001 | Schrems et al. ............ | 438/242 |
| 6,204,141 B1 | * | 3/2001 | Lou ............................ | 438/386 |
| 2002/0022316 A1 | * | 2/2002 | Gutsche et al. ............. | 438/246 |

FOREIGN PATENT DOCUMENTS

EP 0 980 100 A2 2/2000

* cited by examiner

Primary Examiner—John F. Niebling
Assistant Examiner—Jennifer M. Kennedy
(74) Attorney, Agent, or Firm—Laurence A. Greenberg; Werner H. Stemer; Ralph E. Locher

(57) ABSTRACT

A method for fabricating a trench capacitor, that includes steps of: providing a silicon substrate; forming a trench, having a lower region and a surface, in the silicon substrate; and forming a doped layer in the silicon substrate in the lower region of the trench. In addition, a roughened silicon layer that has silicon grains with a diameter ranging from essentially 10 to 100 nm is produced in the lower region of the trench. A dielectric intermediate layer is applied on the roughened silicon layer, and the trench is filled with a doped layer.

15 Claims, 28 Drawing Sheets

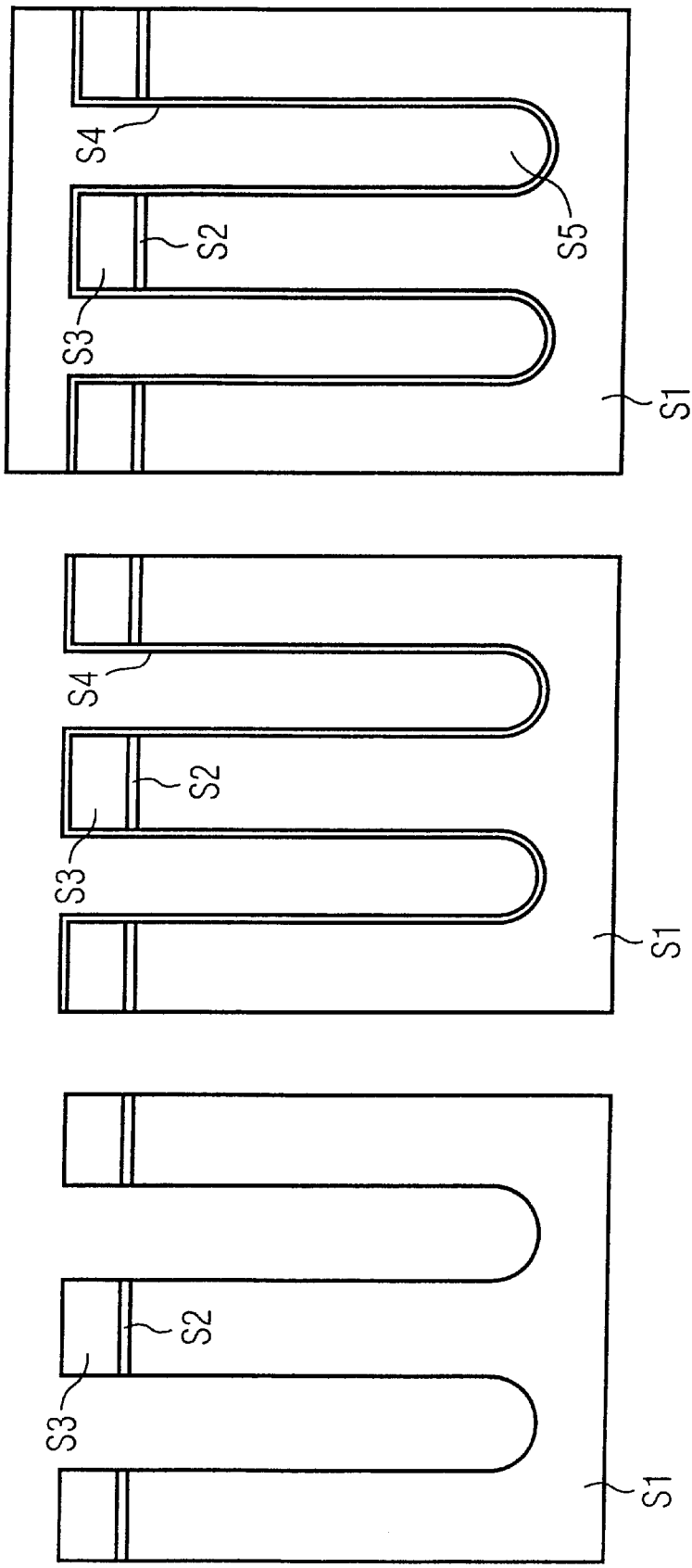

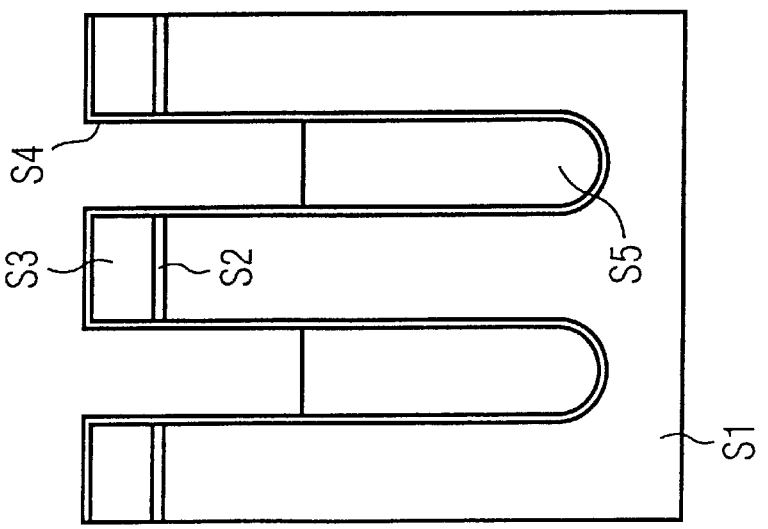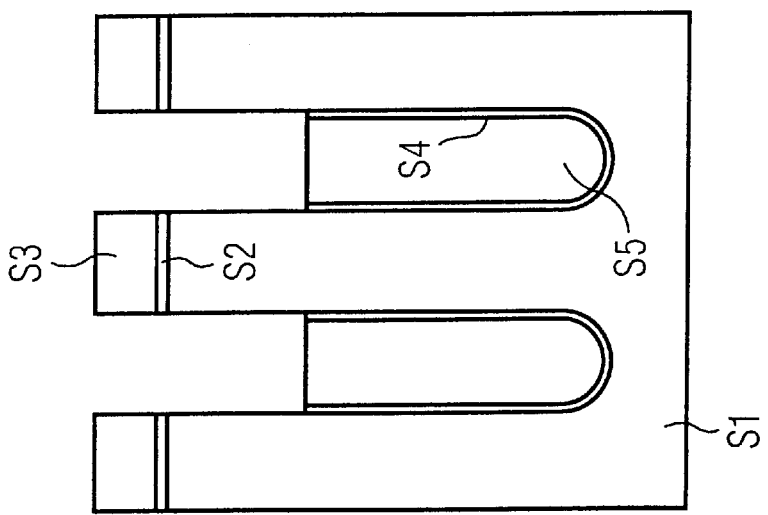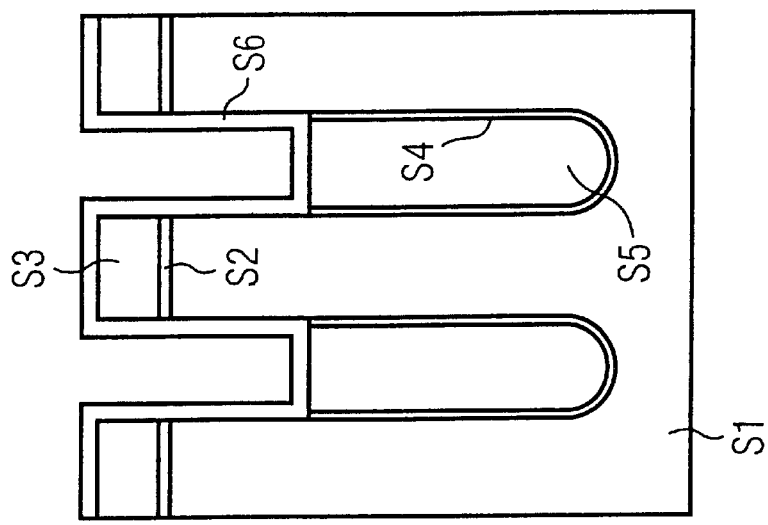

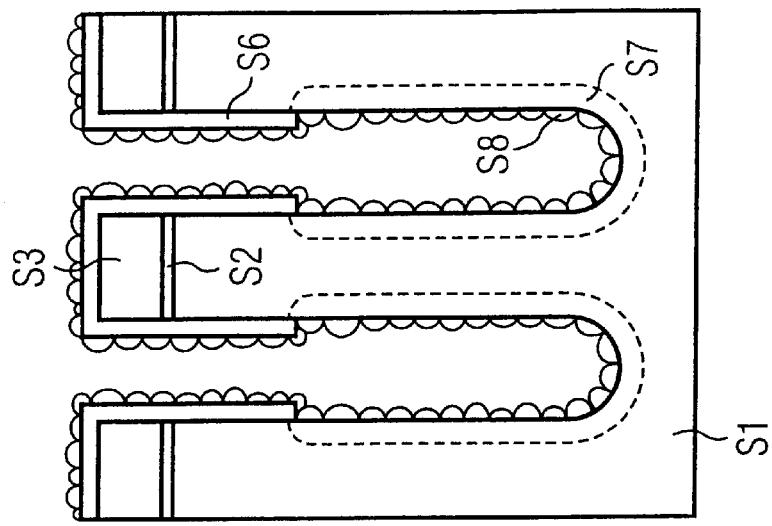
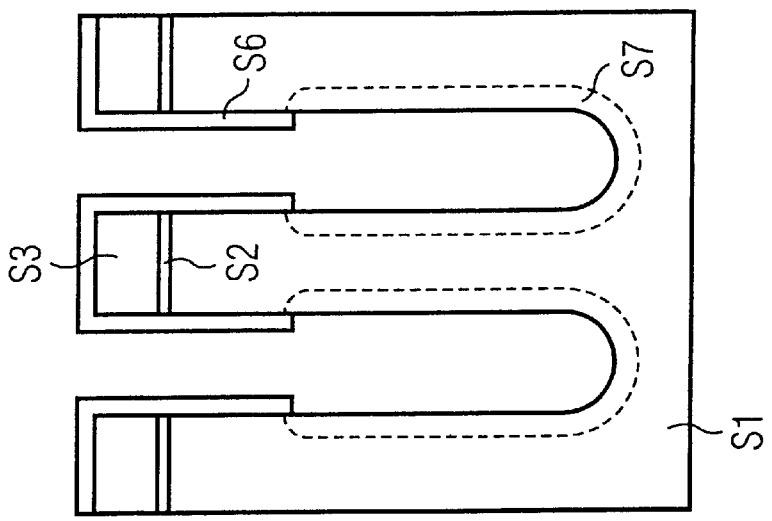
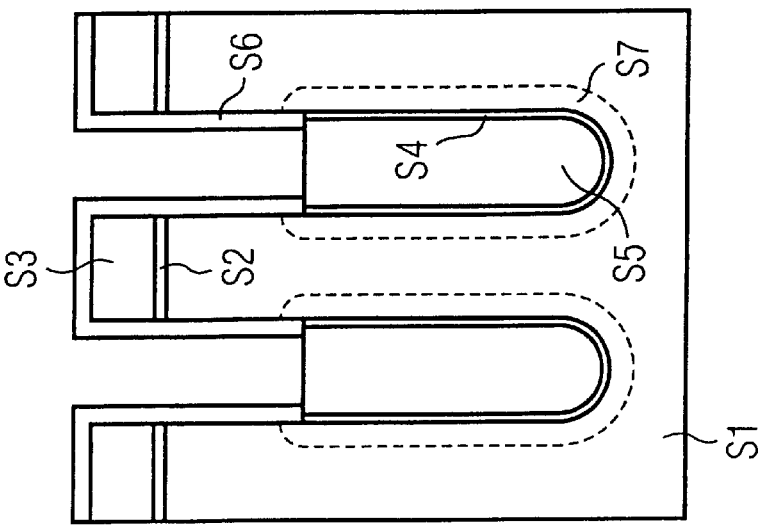

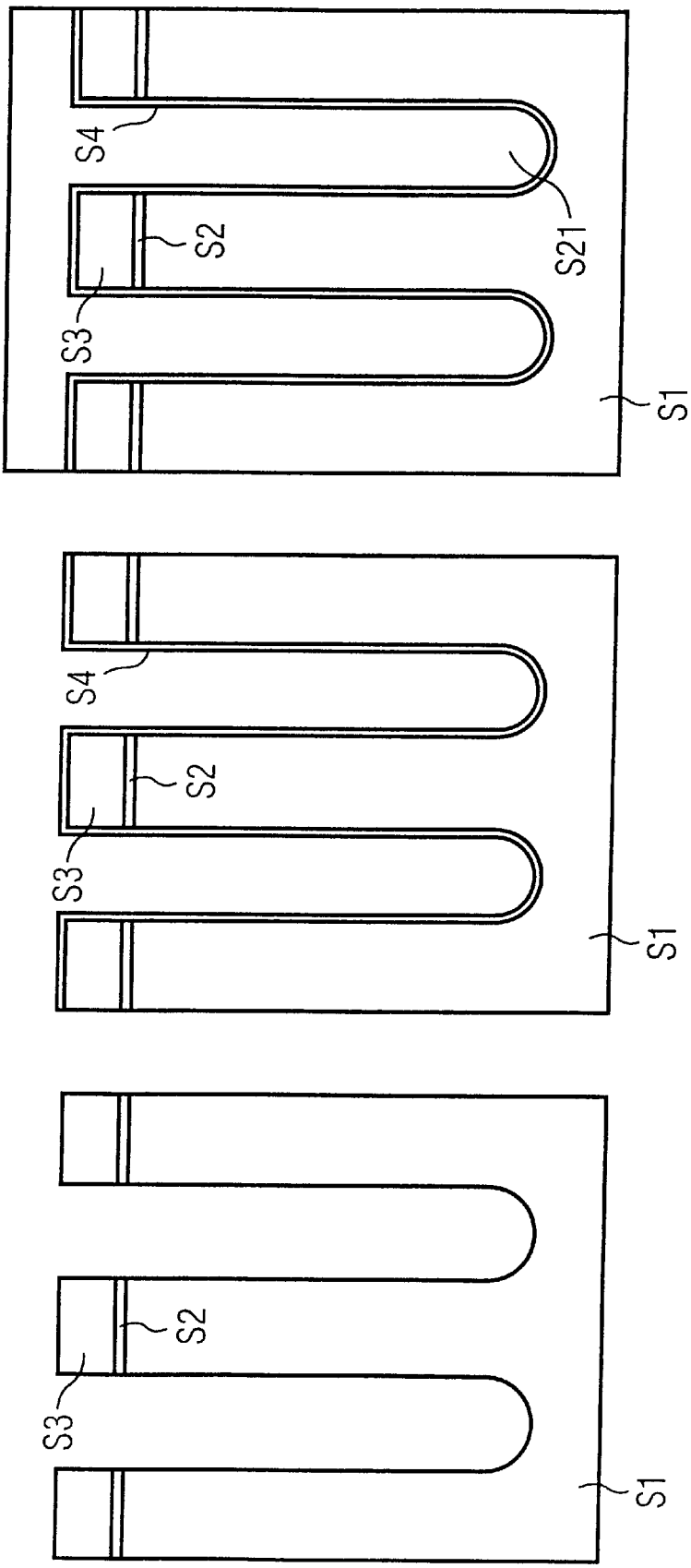

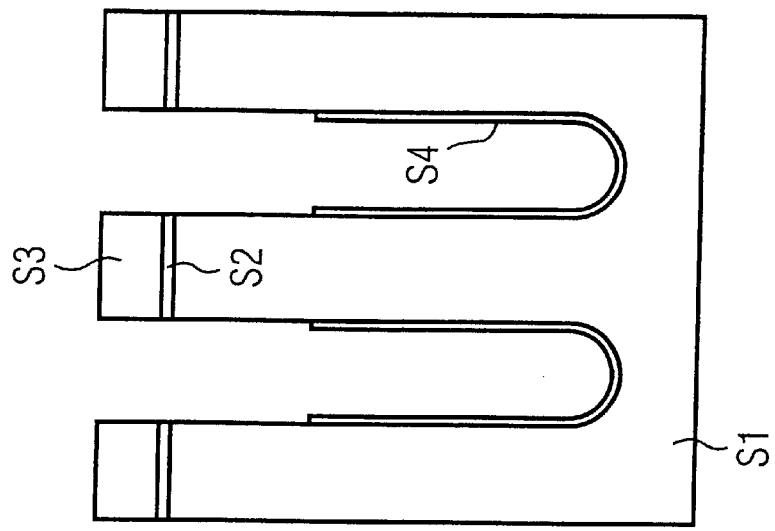
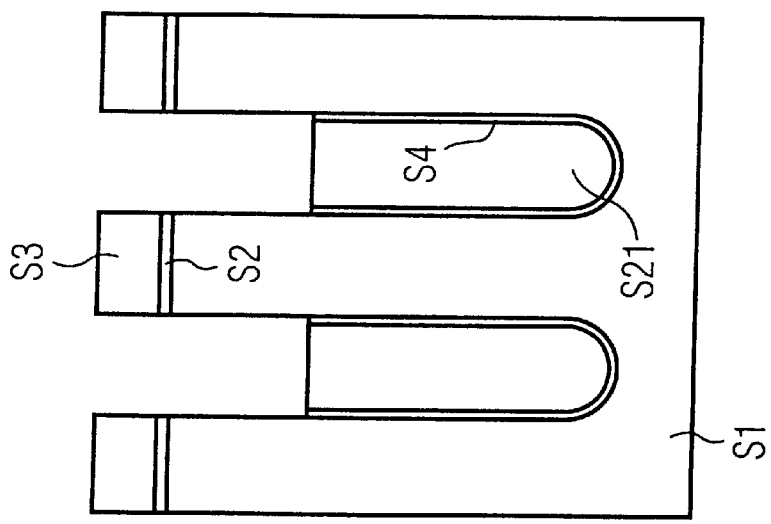
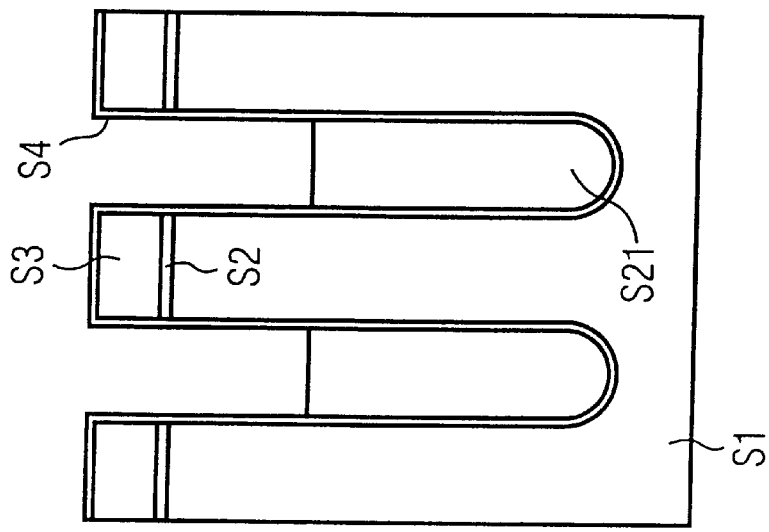

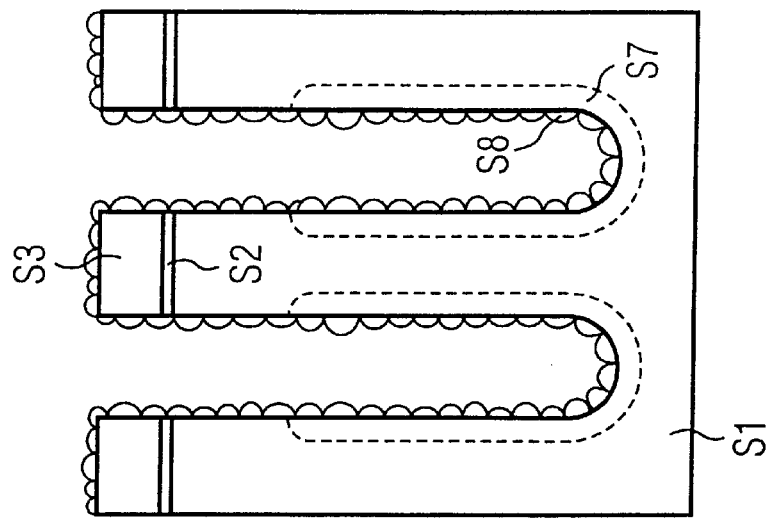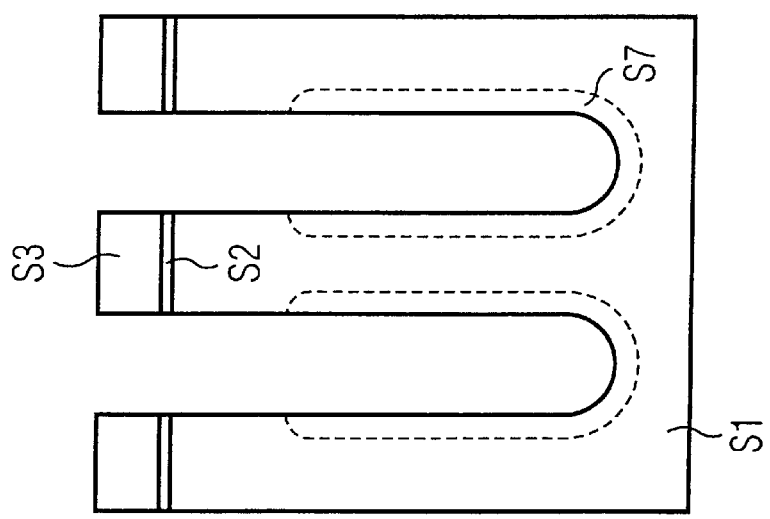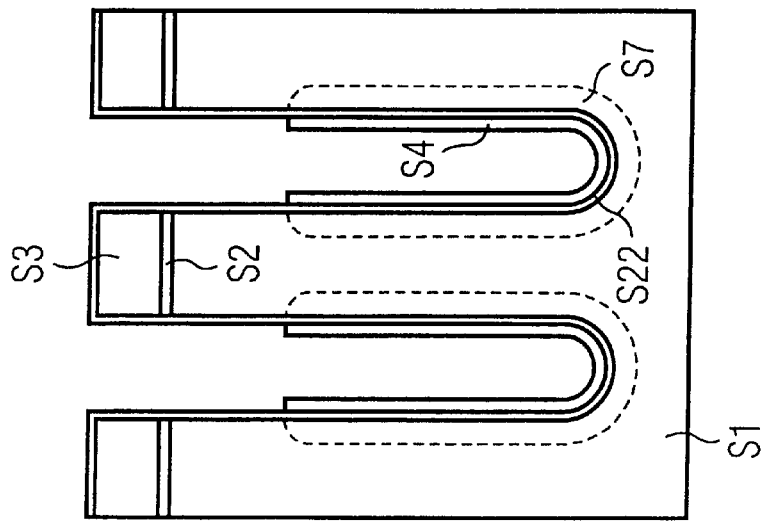

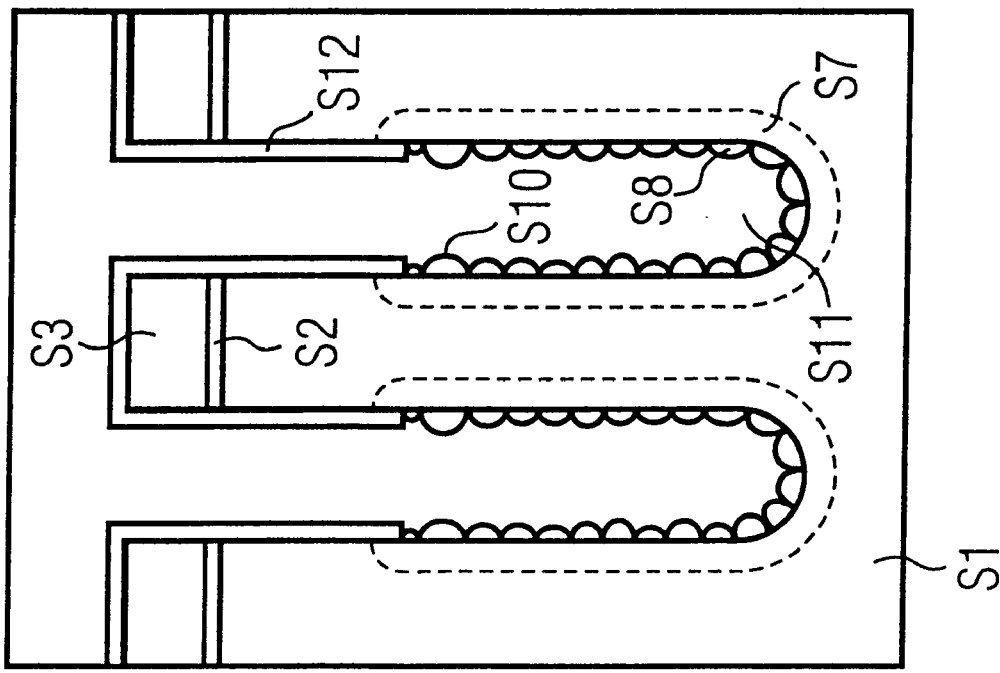
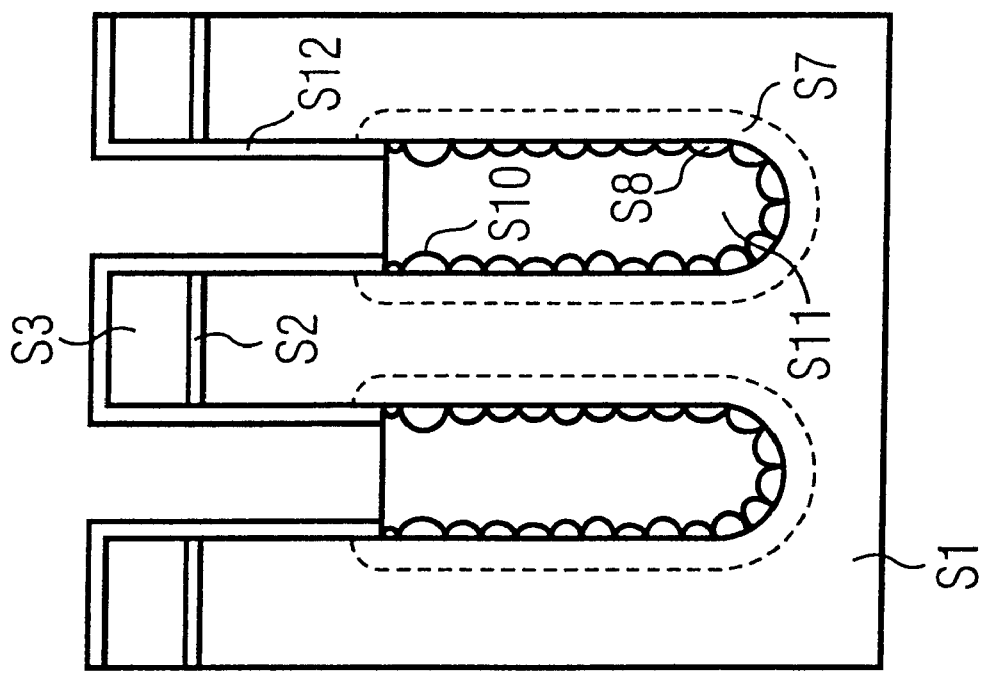

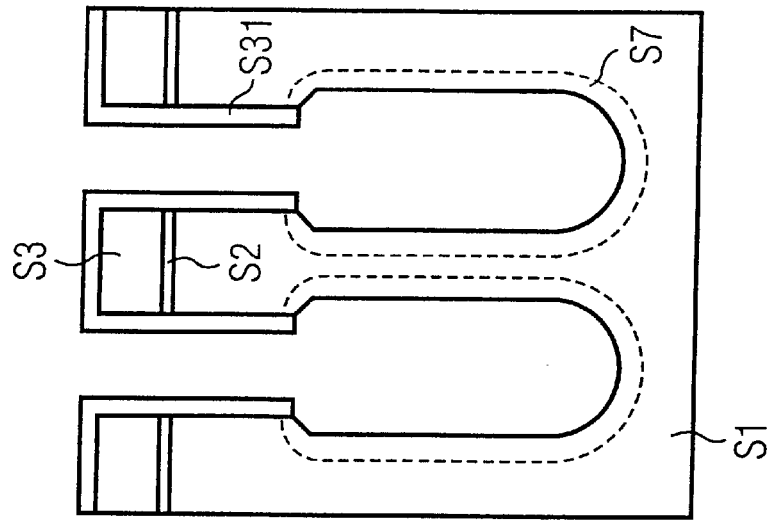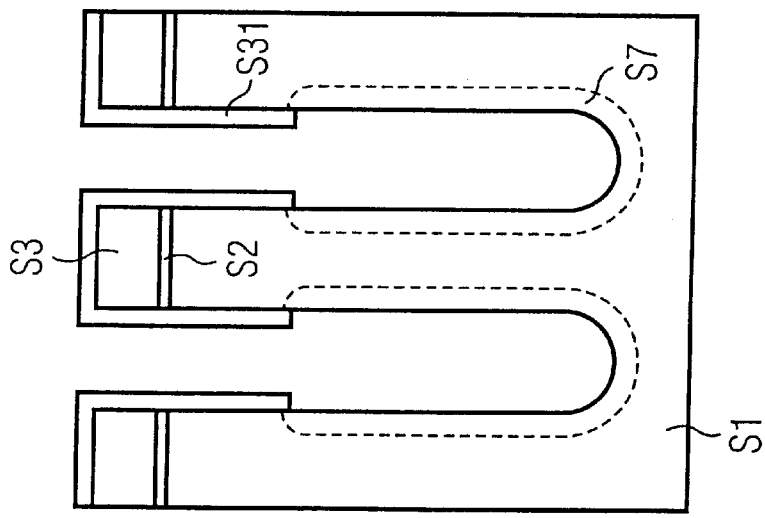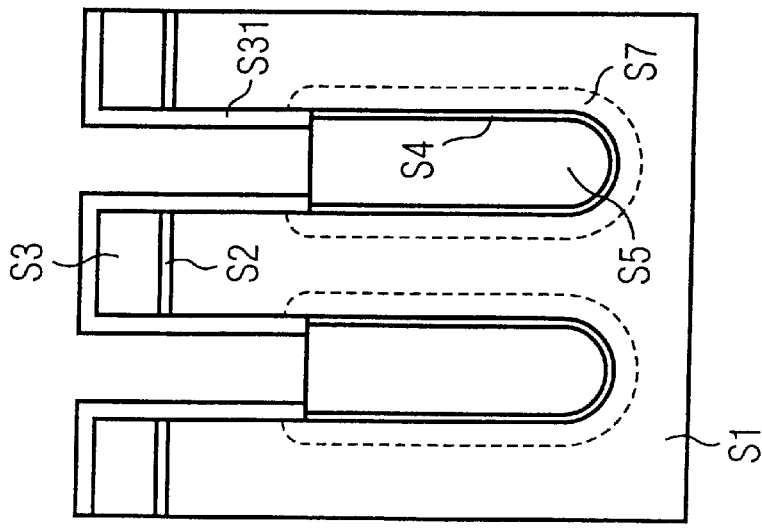

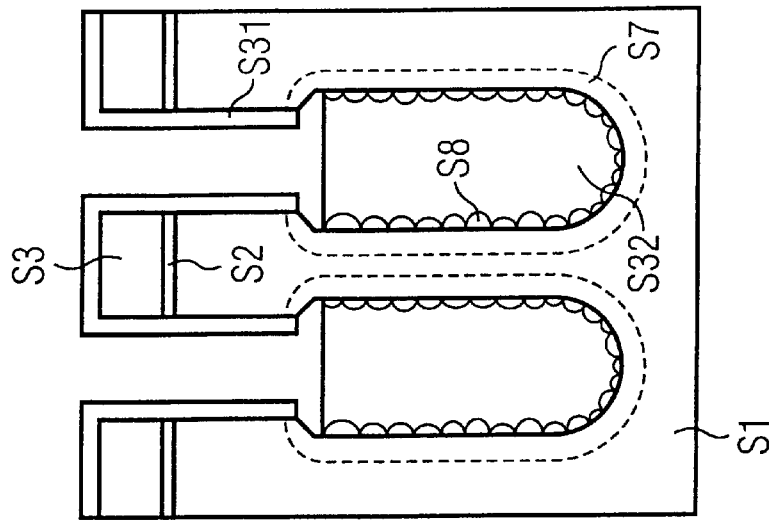
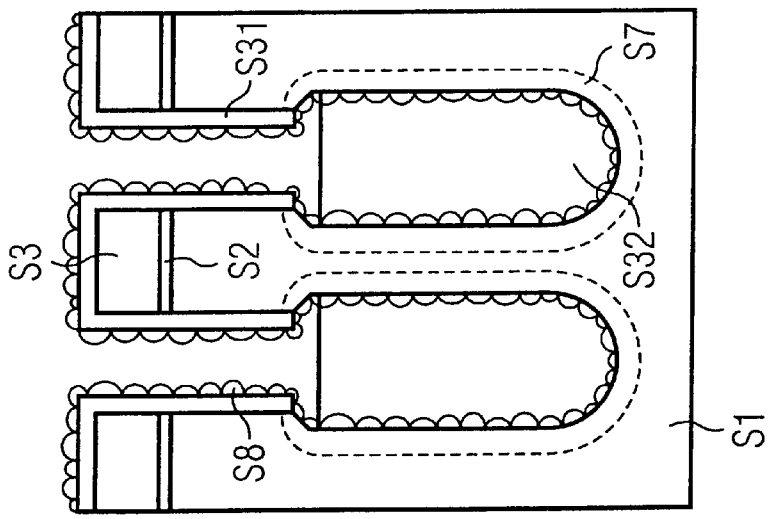
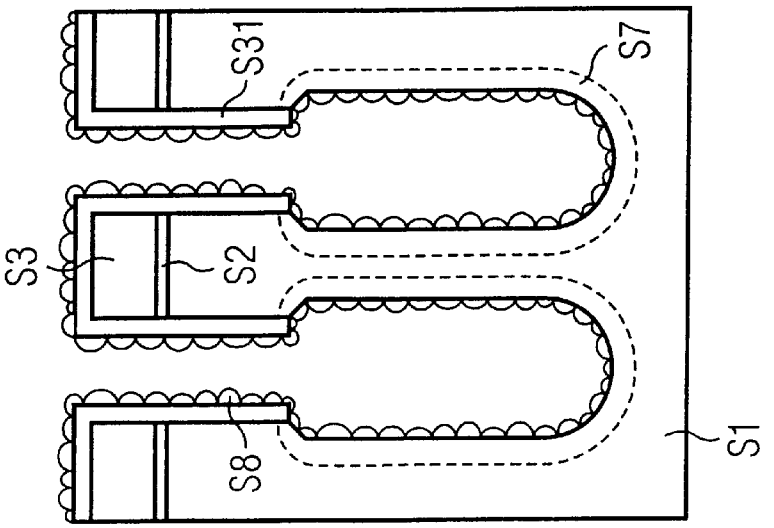

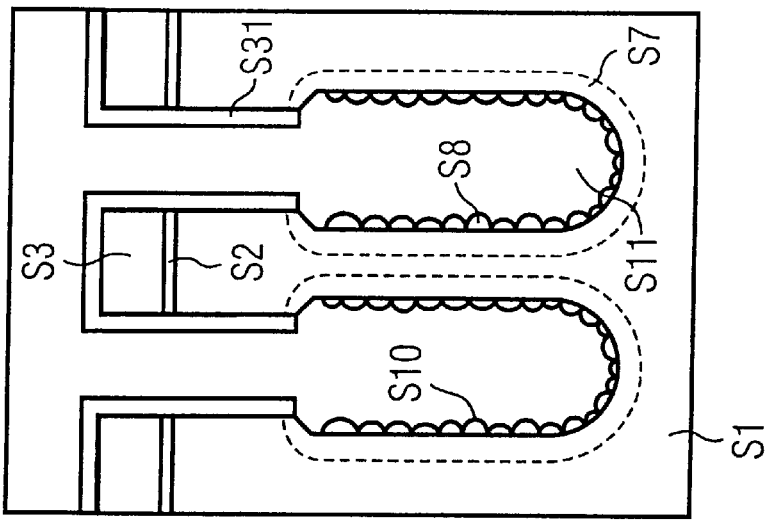
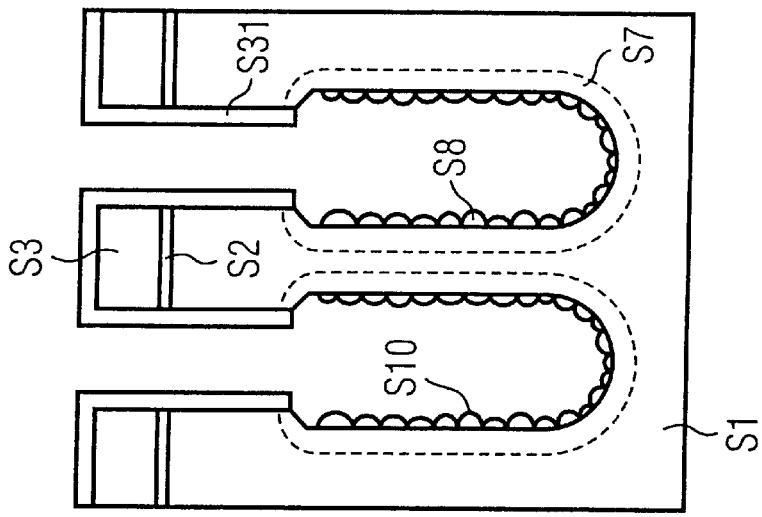
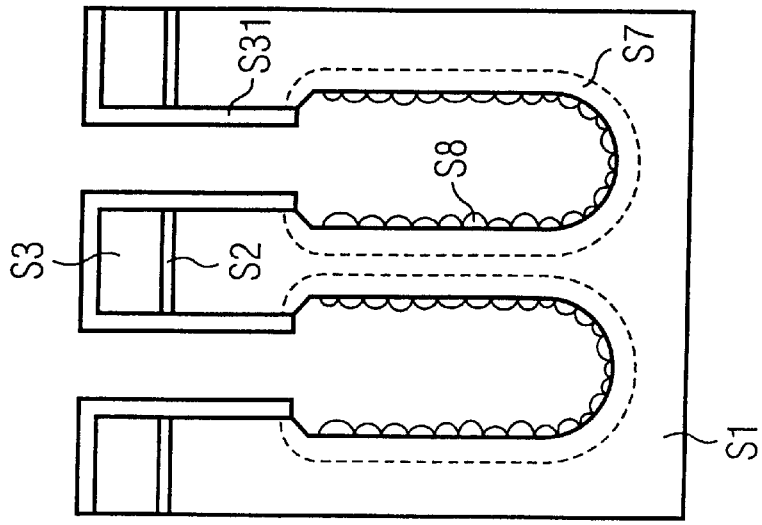

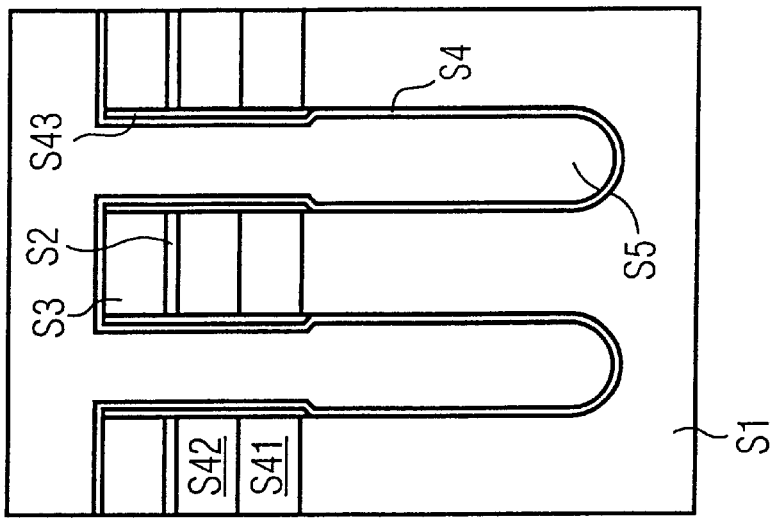
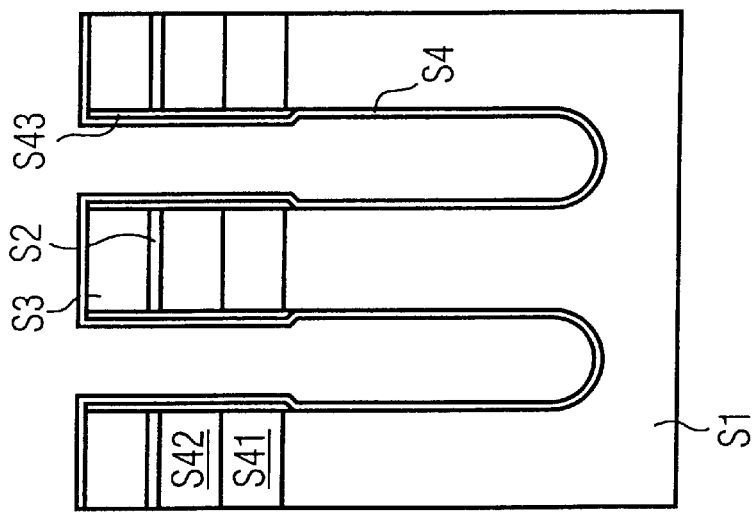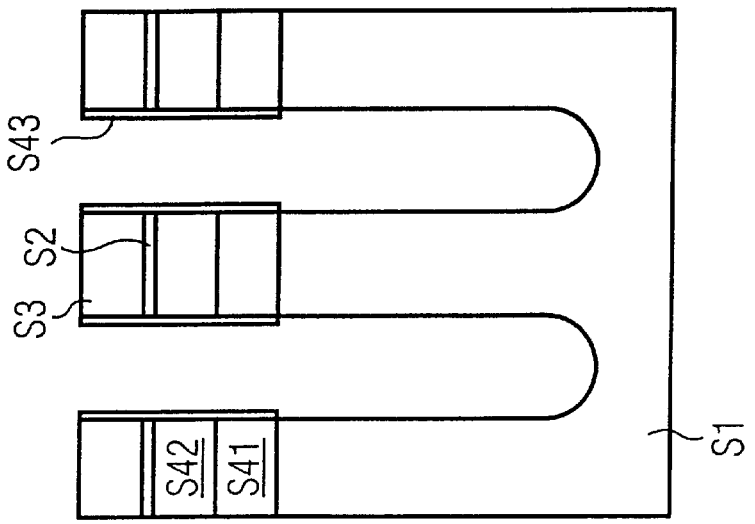

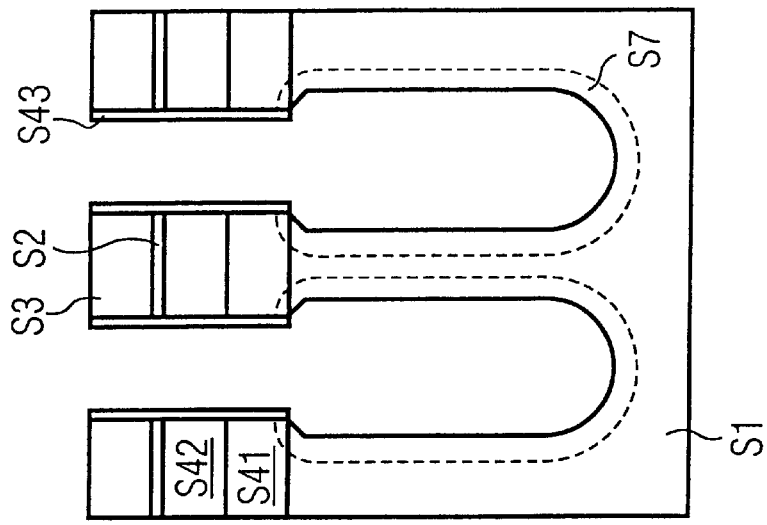
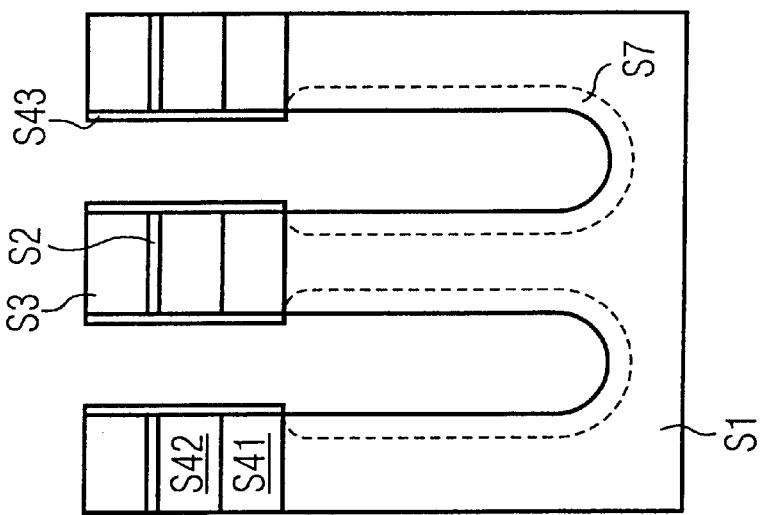
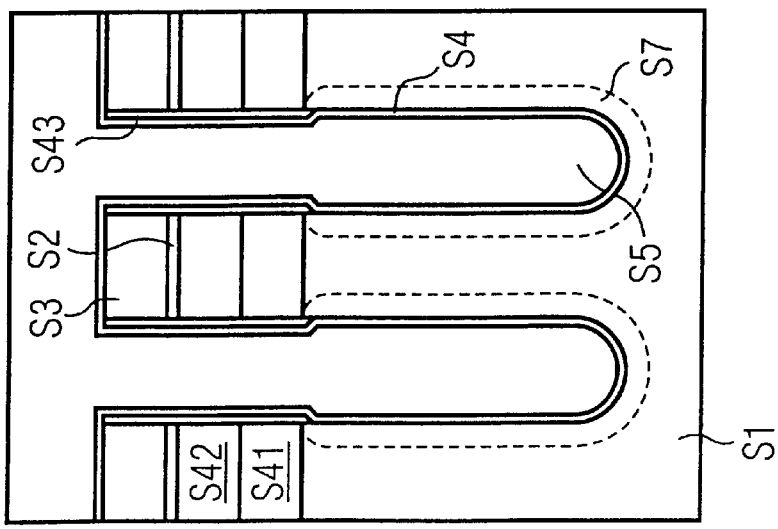

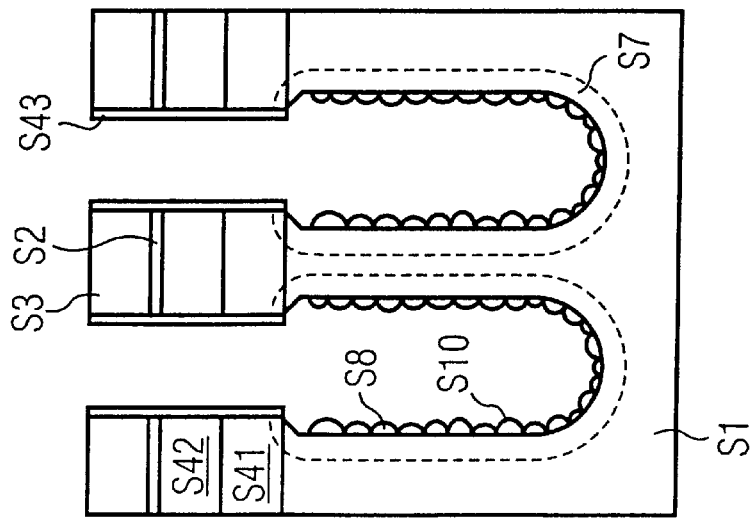
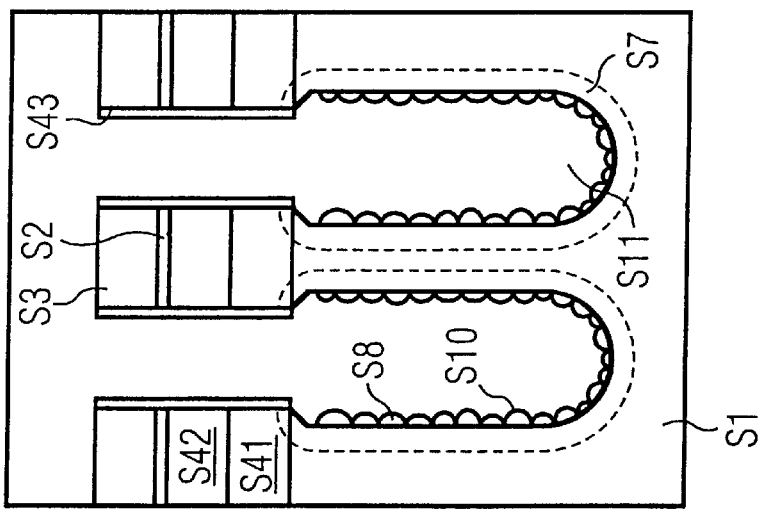
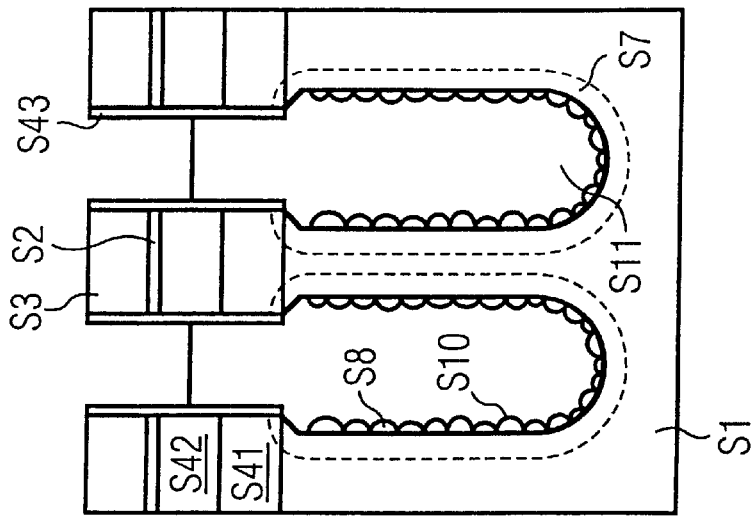

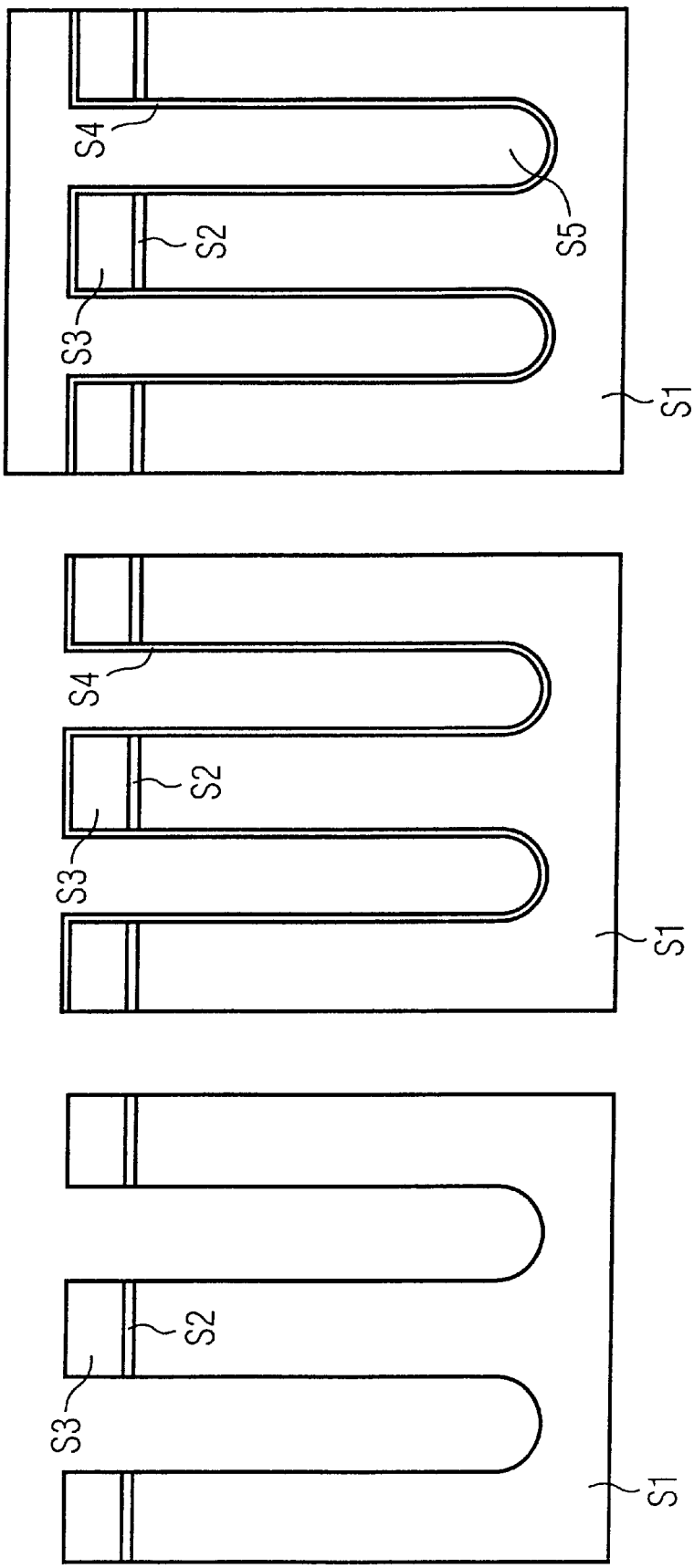

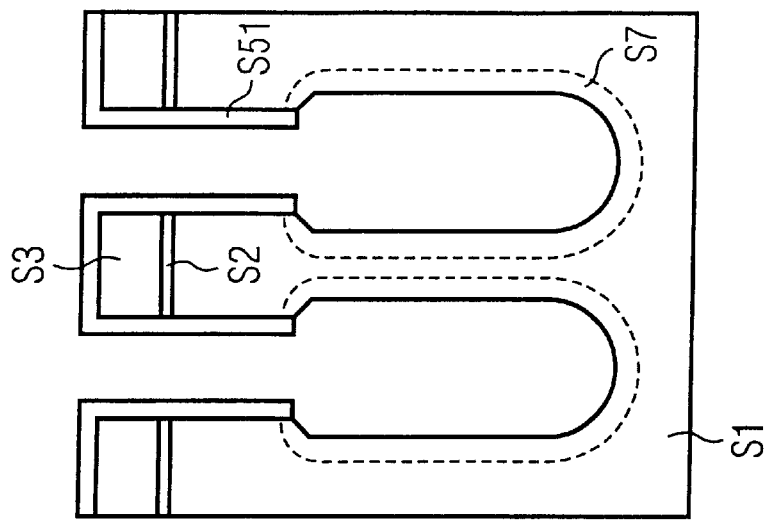
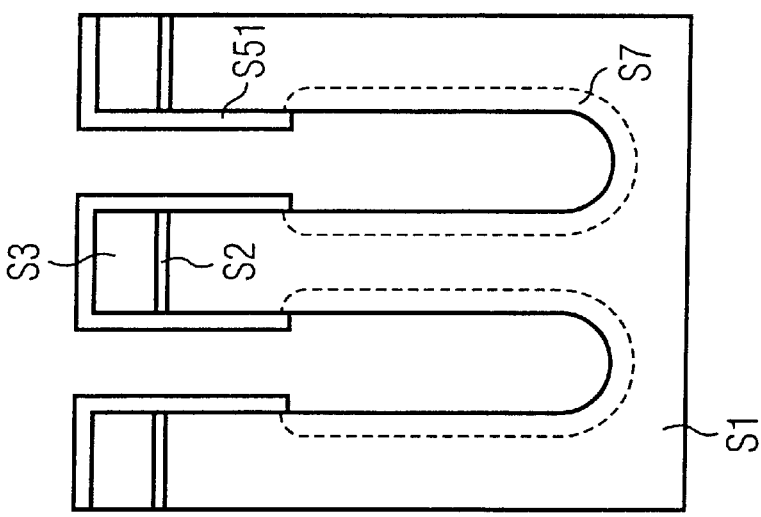
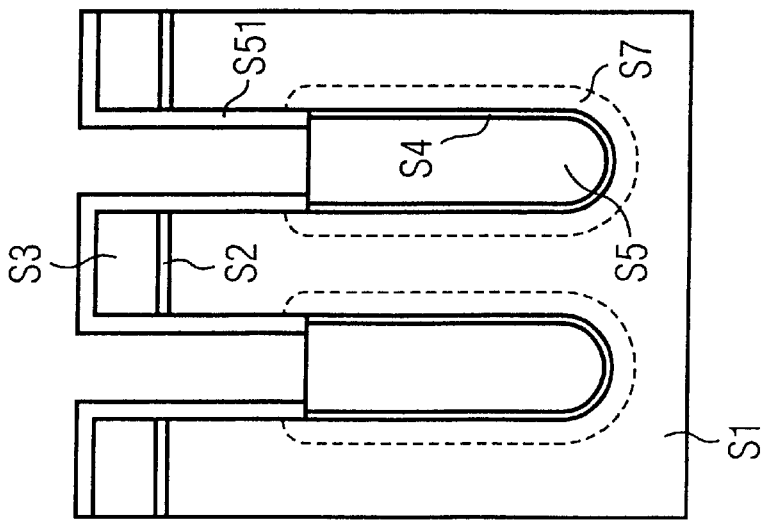

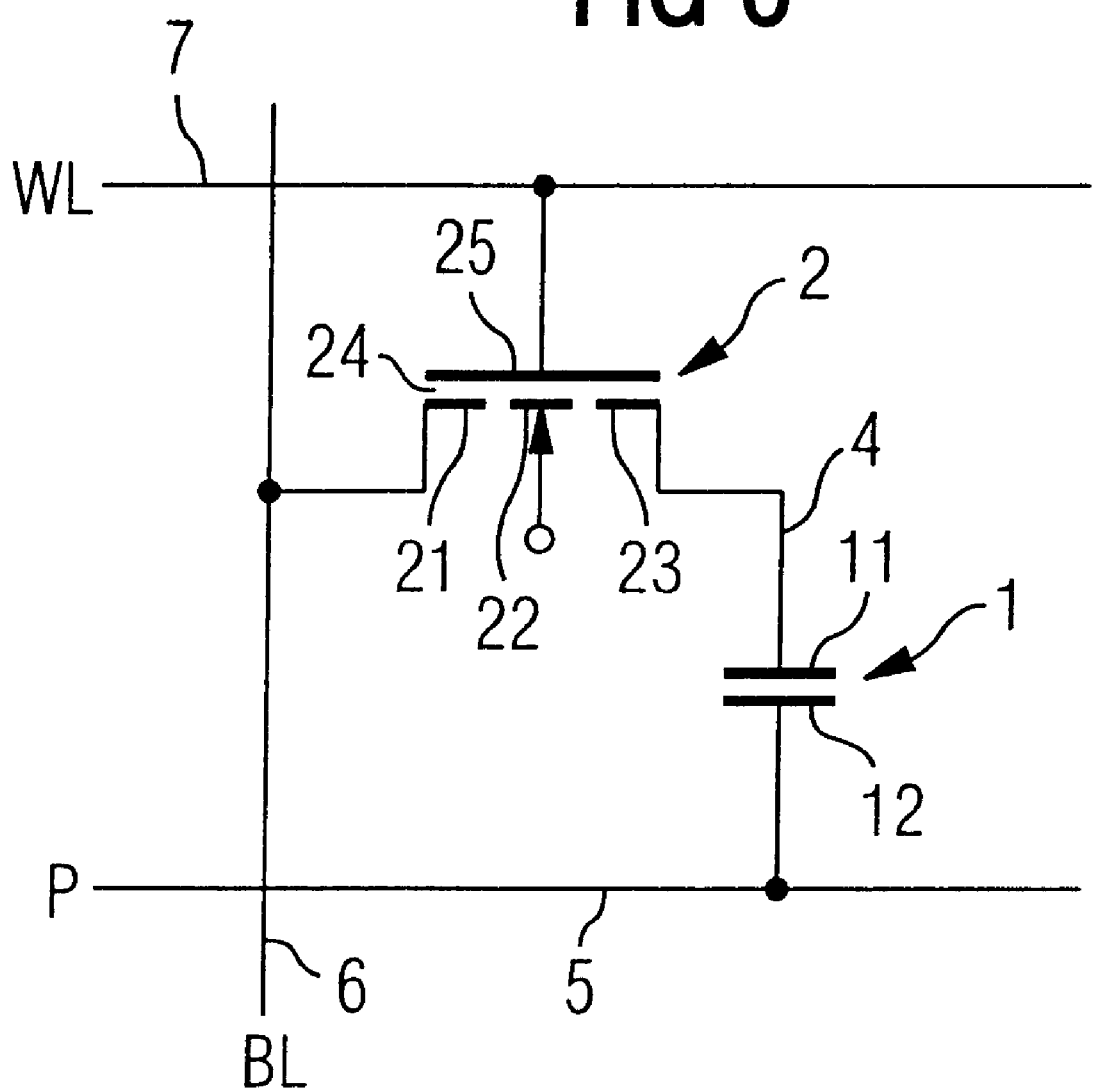

METHOD FOR FABRICATING A TRENCH CAPACITOR

BACKGROUND OF THE INVENTION

Field of the Invention

The present invention relates to a method for fabricating a trench capacitor.

Capacitors are generally used to store charge in integrated circuits (ICs). Thus, the dynamic random access memories (DRAMs) of memory ICs are in each case composed of a selection transistor and a storage capacitor. The information is stored in the storage capacitor in the form of electrical charges. A memory IC includes a matrix of such DRAM cells connected up in the form of rows and columns. Usually, the row connections are referred to as word lines and the column connections as bit lines. In this case, the selection transistor and the storage capacitor in the DRAM cell are connected to one another in such a way that when the selection transistor is driven via a word line, the charge of the storage capacitor can be read in and out via a bit line.

A priority in the technological development of memory ICs with DRAMs is the storage capacitor. In order to obtain an adequate read signal from this storage capacitor, the storage capacitance must be approximately 25–40 fF. In order to provide for such a storage capacitance given that the cell area continually decreases from technological step to technological step for the DRAMs, storage capacitors have been developed, therefore, which utilize the third dimension. In DRAM cells such three-dimensional storage capacitors are embodied for example as trench capacitors which are fabricated by etching a trench into the semiconductor substrate, and filling the trench with a dielectric layer and a first storage electrode. The semiconductor substrate serves as a second storage electrode. The selection transistor of the DRAM cells is then usually formed on the planar semiconductor surface beside the trench capacitor.

The miniaturization of the DRAM cells continues to advance, even with the trench capacitors. Accordingly, ways of ensuring a uniform capacitor capacitance are being sought due to reducing the cell area by decreasing the trench diameter. One possibility here is to increase the depth of the trenches, but this procedure has in the meantime come up against both technological and economic limits. On one hand, the production of ever deeper trenches with a simultaneously reduced trench diameter requires etching methods which achieve very high aspect ratios (ratio of column depth to column width). In the case of the aspect ratio, however, limits are set on the known etching methods. Moreover, above a specific depth, the trench etching requires a greatly prolonged etching time, which significantly increases the costs of the etching process.

Therefore, as an alternative and in addition to further deepening of the trenches, methods are increasing being used which allow the surface within the trench capacitor to be enlarged in order thereby to provide for an adequate storage capacitance. Thus, methods are known in which the trench capacitor is widened in its lower region by means of an additional etching step, as a result of which the capacitor area can be increased. However, the etching processes required for such widening of the trenches likewise come up against technological limits.

In addition to the trench capacitors stacked capacitors are also used for three-dimensional formation of storage capacitors in memory ICs. In principle, a stacked capacitor includes two conductive layers which are arranged one above the other and are isolated by a dielectric layer. In DRAM cells, stacked capacitors are generally formed above the planar selection transistors, and one of the two capacitor electrodes is electrically connected to the selection transistor. In order to achieve the largest possible capacitor area in such stacked capacitors and thus to provide for an adequate storage capacitance, the dielectric layer between the two conductive capacitor layers is preferably embodied in a folded manner. Such stacked capacitors are known under the designation crown stacked capacitors.

Furthermore, in the case of stacked capacitors, methods are also used in which the surface of the conductive capacitor layers is roughened and thereby enlarged. In particular, for the purpose of enlarging the surface, rough polysilicon, so-called hemispherical grain silicon HSG, is used, in the case of which silicon grains having a size of approximately 10 to 100 nm are produced with the aid of a special deposition technique or a temperature treatment. However, since in technological terms the HSG process can be controlled only with very great difficulty, this method for enlarging the surface of the capacitor electrodes and thus for increasing the total capacitance of the capacitor has hitherto been used exclusively with stacked capacitors. Methods for fabricating HSG layers in stacked capacitors are disclosed inter alia in U.S. Pat. Nos. 5,723,379, 5,858,852 and 5,858,837.

Furthermore, U.S. Pat. No. 5,877,061 discloses a trench capacitor in which an improved capacitor capacitance is achieved by means of a roughened surface in the region of the capacitor electrodes. For this purpose, a granular polysilicon layer or an HSG silicon layer is deposited in the region in which the capacitor electrodes are intended to be formed in the trench, and is subsequently etched away isotropically, so that a roughened silicon surface remains in the capacitor electrode region. This technique for increasing the capacitance in the trench capacitor is complicated, however, since additional etching processes are provided. Furthermore, there is the risk that the granular polysilicon layer or the HSG silicon layer will not be completely etched away in particular in the collar region, which serves to insulate the capacitor electrodes, as a result of which leakage current paths can arise.

In the case of low or even a lack of etching selectivity with respect to the etching mask, isotropic etchings furthermore tend to compensate roughnesses that are originally present, as a result of which the roughness initially present in the HSG can only be incompletely transferred to the underlying silicon.

It would also be desirable, however, if it were possible in the case of trench capacitors to obtain enlarged capacitor surfaces, and thus an increased storage capacitance, by means of rough surfaces according to the HSG method. A use of HSG silicon in trench capacitors has not succeeded, however, in particular because the known methods do not allow the HSG silicon to be limited to the regions in the trench capacitor which serve as an electrode surface. In trench capacitors, a dielectric collar is usually produced in the region of the trench in order to prevent a parasitic vertical field-effect transistor from being produced. When using HSG silicon for enlarging the electrode surface, there is the risk, however, that, in particular, HSG silicon will also remain in the collar region, which can then lead to undesirable leakage currents.

Published European Patent Application EP 980 100 A2 discloses a method of the generic type. In this known method for fabricating a trench capacitor, an HSG silicon layer is first produced on the entire surface of the trench. Afterward, the lower region of the HSG silicon layer is masked and the HSG silicon layer in the upper region is then converted into an oxide layer. A lower part of this oxide layer is then extended and used as an insulation collar.

SUMMARY OF THE INVENTION

It is accordingly an object of the invention to provide a simple and reliable method for producing an HSG silicon layer in a trench capacitor which overcomes the above-mentioned disadvantageous of the prior art methods of this general type. In particular, it is an object of the invention to provide such a method in which the HSG silicon layer is limited exclusively to the region of the electrode surfaces.

With the foregoing and other objects in view there is provided, in accordance with the invention, a method for fabricating a trench capacitor, that includes steps of: providing a silicon substrate; forming a trench, having a lower region and a surface, in the silicon substrate; and forming a doped layer in the silicon substrate in the lower region of the trench. In addition, a roughened silicon layer that has silicon grains with a diameter ranging from essentially 10 to 100 nm is produced in the lower region of the trench by performing steps of: depositing an amorphous silicon layer on all of the surface of the trench, patterning the amorphous silicon layer by etching such that the amorphous silicon layer is limited to the lower region of the trench, and subsequently nucleating the amorphous silicon layer to form the silicon grains. A dielectric intermediate layer is applied on the roughened silicon layer; and the trench is filled with a doped layer.

In accordance with an added feature of the invention, the step of producing the roughened silicon layer is performed by: depositing essentially smooth amorphous silicon at a temperature below the transition temperature from amorphous silicon to polycrystalline silicon; and subsequently converting the essentially smooth silicon layer into the roughened silicon layer by performing a heating step at a temperature selected from the group consisting of a temperature close to the transition temperature and a temperature above the transition temperature.

In accordance with an additional feature of the invention, before producing the roughened silicon layer, an insulation layer is formed in an upper region of the trench.

In accordance with another feature of the invention, the nucleating step is performed by selectively nucleating the amorphous silicon layer in the lower region of the trench to form the silicon grains.

In accordance with a further added feature of the invention, after producing the roughened silicon layer, an insulation layer is formed in an upper region of the trench.

In this embodiment, selective production of a roughened silicon layer in the lower trench region is performed. Amorphous, non-roughened silicon is deposited on the trench surface and then is patterned, as a result of which the amorphous silicon layer, from which the silicon grains are subsequently produced, remains only in the lower trench region in which the capacitor electrodes are formed. This configuration makes it possible, in a particularly simple manner, to produce the roughened silicon layer only in the region of the electrode surfaces.

With the foregoing and other objects in view there is also provided, in accordance with the invention, a method for fabricating a trench capacitor, that includes steps of: providing a silicon substrate; forming a trench, which has a lower region and a surface, in the silicon substrate; and forming a doped layer in the silicon substrate in the lower region of the trench. A roughened silicon layer, having silicon grains with a diameter ranging from essentially 10 to 100 nm, is produced in the lower region of the trench by: producing the roughened silicon layer on all of the surface of the trench, masking the lower region of the trench, and using an etching method to remove the roughened silicon layer from an upper region of the trench. A dielectric intermediate layer is applied on the roughened silicon layer, and the trench is filled with a doped layer.

In accordance with an added feature of this embodiment of the invention, before performing the etching method to remove the roughened silicon layer, the roughened silicon layer is planarized in the upper region of the trench.

In accordance with an additional feature of this embodiment of the invention, the planarizing step is performed using a high-temperature step in which the roughened silicon layer in the lower region of the trench is masked by a temperature-stable layer.

In accordance with another feature of this embodiment of the invention, the step of producing the roughened silicon layer is performed by depositing silicon at a transition temperature between amorphous silicon and polycrystalline silicon.

In accordance with a further feature of this embodiment of the invention, the step of producing the roughened silicon layer is performed by: depositing an essentially smooth amorphous silicon at a temperature below a transition temperature between amorphous silicon and polycrystalline silicon; and subsequently converting the essentially smooth silicon layer into the roughened silicon layer by performing a heating step at a temperature selected from the group consisting of a temperature close to the transition temperature and a temperature above the transition temperature.

In accordance with a further added feature of this embodiment of the invention, before producing the roughened silicon layer, an insulation layer is formed in an upper region of the trench.

In accordance with a further additional feature of this embodiment of the invention, the nucleating step is performed by selectively nucleating the amorphous silicon layer in the lower region of the trench to form the silicon grains.

In accordance with yet an added feature of this embodiment of the invention, after producing the roughened silicon layer, an insulation layer is formed in an upper region of the trench.

In other words in this embodiment, a roughened silicon layer is first produced on the entire surface of the trench. The lower region of this roughened silicon layer is subsequently masked and the roughened silicon layer in the upper region then is removed using an etching method. In order to remove the roughened silicon layer in the upper trench region, it is preferable to first planarize the previously produced silicon grains under suitable process conditions. The roughened silicon layer in the lower trench region is preferably protected by a temperature-stable layer during the planarization.

The process sequence ensures that the roughened silicon layer is reliably removed in the insulation collar region and the masking in the lower region simultaneously prevents this roughened silicon layer region from being damaged during the patterning. In this case, the planarization step that is additionally possible enables particularly simple removal or alteration of the roughened silicon layer in the upper trench region.

Using the method, it is thus possible to produce a trench capacitor in which the surface of the capacitor electrodes is greatly enlarged by the roughened silicon surface, as a result of which the capacitance of the trench capacitor is increased and it is simultaneously ensured that the roughened silicon layer is formed only on the electrode surface within the trench. This construction ensures that no leakage current flows between the electrodes of the trench capacitor, which leakage current would lead to a rapid loss of the stored charge in the trench capacitor. At the same time, limiting the roughened silicon layer to the electrode surface prevents the occurrence of impermissible constriction of the upper trench section, which is necessary for making contact with the selection transistor.

In order to fabricate a trench capacitor, after the formation of a doped layer in the silicon substrate in the lower region of the trench, either an insulation layer is produced in the upper region of the trench for the purpose of forming the insulation collar and the roughened silicon layer is then produced in the lower region of the trench, or after the formation of the doped layer in the silicon substrate in the lower region of the trench, first the roughened silicon layer is produced in this region and then the insulation layer for the insulation collar is formed in the upper region.

Other features which are considered as characteristic for the invention are set forth in the appended claims.

Although the invention is illustrated and described herein as embodied in a trench capacitor and method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 4a–4m show a fourth embodiment of the method for fabricating a trench capacitor with non-selective HSG silicon production after the formation of the insulation collar;

FIG. 6 shows a circuit diagram of a DRAM cell; and

DESCRIPTION OF THE PREFERRED EMBODIMENTS

Figure 1J:
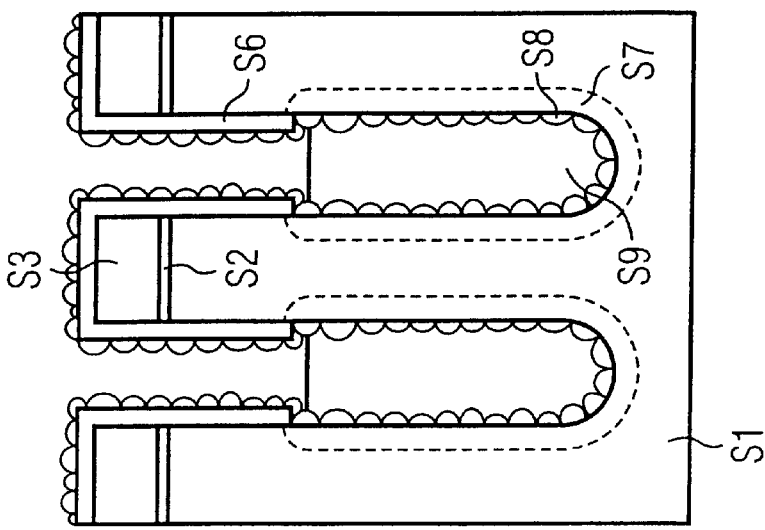
FIGS. 1a–1o show a first embodiment of a method for fabricating a trench capacitor with non-selective HSG silicon production before the formation of the collar.

The invention is explained with reference to the fabrication of trench capacitors in the context of a process sequence for forming silicon-based DRAM memory cells. However, the trench capacitors can also be used in other large scale integrated circuits in which capacitors are required. The trench capacitors are preferably formed using silicon planar technology including sequences of individual processes which each act on the whole area of the wafer surface, and a local alteration of the silicon substrate is carried out in a targeted manner using suitable marking layers. During the DRAM fabrication, a multiplicity of cells with the corresponding trench capacitors are formed simultaneously. In the text below, however, the method is described only with regard to the formation of a single trench capacitor.

Referring now to the figures of the drawing in detail and first, particularly, to FIG. 6 thereof, there is shown a circuit diagram of a one-transistor cell that is predominantly used in DRAM memories. These one-transistor cells include a storage capacitor 1 and a selection transistor 2. In this case, the selection transistor 2 is preferably designed as a field-effect transistor and has a current-supplying source electrode 21 and a current-accepting drain electrode 23, between which an active region 22 is arranged in which a current-conducting channel can be formed between the source electrode 21 and the drain electrode 23. An insulator layer 24 and a gate electrode 25 are arranged above the active region 22, which act like a plate capacitor which can be used to influence the charge density in the active region 22.

The drain electrode 23 of the field-effect transistor 2 is connected to a first electrode 11 of the storage capacitor 1 via a connecting line 4. A second electrode 12 of the storage capacitor 1 is in turn connected to a capacitor plate 5 which is preferably common to all of the storage capacitors of the DRAM cell arrangement. The source electrode 21 of the field-effect transistor 2 is connected to a bit line 6 in order that the information items stored in the storage capacitor 1 in the form of charges can be read in and out. The read-in and -out operation is in this case controlled via a word line 7 connected to the gate electrode 25 of the field-effect transistor 2 in order to produce a current-conducting channel in the active region 22 between the source electrode 21 and the drain electrode 23 by the application of a voltage.

In many cases, a trench capacitor is used as the capacitor 1 in DRAMs, since the three-dimensional structure enables the DRAM cell area to be significantly reduced. With increasing miniaturization of the DRAM cells and thus ever decreasing cross sections of the trench capacitor, additional measures are necessary in order to provide an adequate capacitor capacitance of approximately 25–40 fF, which is required in order to obtain a sufficiently large read signal of the DRAM.

One possibility of increasing the capacitance in trench capacitors is to produce deeper trenches. However, in this case both technological and economic limits are imposed on the etching methods required for this. An alternative possibility, therefore, is to increase the capacitor capacitance by enlarging the surface within the trench capacitor. In this case, in particular, techniques are used which widen the lower region of the trench capacitor with the capacitor electrodes in order thus to produce larger electrode surfaces. However, even with such widening of the lower trench regions, only a limited increase in capacitance can be achieved on account of the available cell regions and the required etching methods. In the method disclosed herein, therefore, the surface of the capacitor electrodes is roughened, and thus additionally enlarged, by a silicon layer with silicon grains which have a diameter of essentially 10 to 100 nm. In this case, such a silicon layer, known as HSG silicon, is preferably limited to the electrode surfaces in order to prevent leakage current paths between the electrodes of the trench capacitor. Small HSG residues may, however, be tolerated in the lower collar region.

Figure 7:
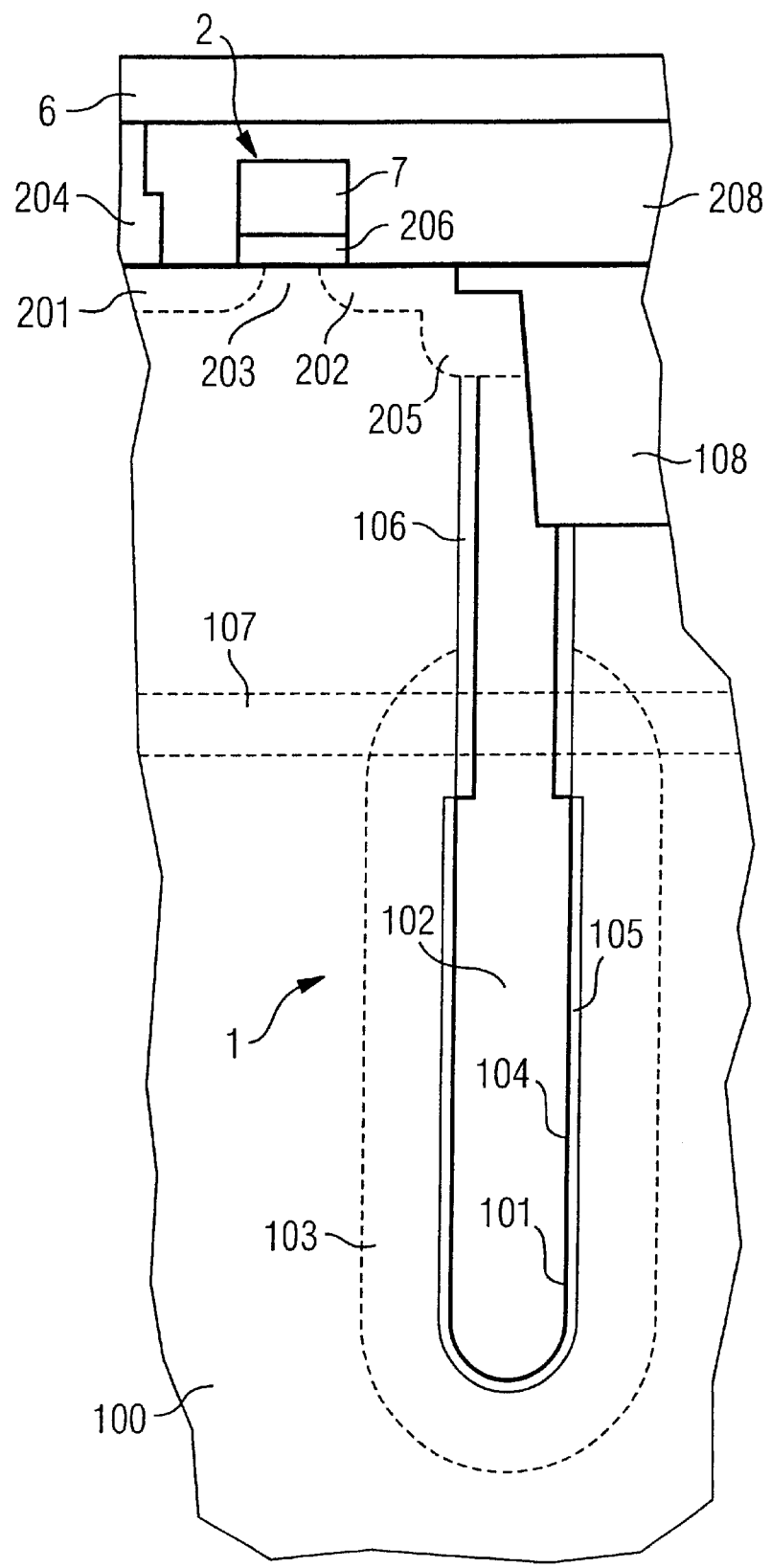
FIG. 7 shows a diagrammatic cross section through a DRAM cell with a trench capacitor.

FIG. 7 a shows a cross section through one possible embodiment of an inventive trench capacitor in a DRAM memory cell. In this case, the trench capacitor 1 is formed in a preferably monocrystalline silicon substrate 100. The substrate is preferably weakly p (p$^-$) doped e.g. with boron (B). A trench 101 made in the silicon substrate 100 is preferably filled with polysilicon 102, which is highly n (n$^+$) doped e.g. with arsenic (As) or phosphorus (P). This polysilicon 102 forms the inner electrode of the trench capacitor 1.

In the silicon substrate 100, in the lower region of the trench 101, an n$^+$-doped layer 103 is formed around the trench, the layer being doped with As, for example. This n$^+$-doped layer 103, also referred to as buried plate below, serves as the outer electrode of the trench capacitor 1. Arranged between the two electrodes of the trench capacitor 1 is a storage dielectric 104, which isolates the capacitor electrodes. In this case, the storage dielectric 104 may include a stack of dielectric layers, e.g. oxide, nitride oxide or oxide-nitride-oxide. Furthermore, an HSG silicon layer 105 is formed between the storage dielectric 104 and the buried plate 103. With this HSG silicon layer 105, the surface of the buried plate 103, which serves as the outer electrode of the trench capacitor 1, can be enlarged by 25% to distinctly above 100% in comparison with a planar surface, depending on the grain size of the HSG layer, and, consequently, the capacitor capacitance can also be increased to a corresponding extent. In the embodiment shown, the HSG silicon layer is arranged between the storage dielectric 104 and the buried plate 103.

The HSG silicon layer 105 is preferably n$^+$-doped in a similar manner to the buried plate 103, in order to prevent a depletion zone from occurring in the region of the HSG silicon layer, which would lead to a reduction of the capacitance of the trench capacitor 1. Such doping can be achieved by: carrying out a back-diffusion of doping atoms from the buried plate 103, carrying out a doping of the HSG layer during deposition, or subsequently doping the HSG layer after deposition.

The selection transistor 2 of the DRAM cell in the embodiment shown in FIG. 7 has two diffusion regions 201, 202, which are produced by the implantation of doping atoms in the silicon substrate 100 and are separated by a channel 203. The first diffusion region 201 is connected to the bit line 6 via a contact 204. The second diffusion region 202 is connected via a capacitor connection region 205 to the polysilicon layer 102, which serves as the inner electrode of the trench capacitor 1. The channel 203 is isolated from the word line 7 by a gate dielectric layer 206.

In the upper region of the trench 101, an insulation layer 106 is formed around the polysilicon 102 in a manner adjoining the storage dielectric 104. The insulation layer 106 prevents a leakage current between the capacitor connection 205 and the buried plate 103, which forms the outer electrode of the trench capacitor 1. Such a leakage current would significantly shorten the retention time of the charges in the trench capacitor and thus undesirably increase the required refresh frequency of the DRAM cell.

Furthermore, an n-doped plate 107 is provided in the silicon substrate 100, which plate serves as a connection of the buried plate 103 to the buried plates of the further DRAM memory cells and is biased with a connection from above. An isolation trench 108 (STI isolation) is formed for the purpose of insulation between the DRAM cells.

Furthermore, the gate electrode or the word line 7 is insulated from the bit line 6 and the contact 204 to the first diffusion region 201 by an oxide layer 208.

The capacitor capacitance is significantly increased by the enlargement of the electrode surfaces with the aid of the HSG silicon layer 105 between the storage dielectric 104 and the buried plate 103 which serves as the outer electrode of the trench capacitor 1. As an additional measure, it is possible to widen the lower region of the trench 101 in the region of the buried plate 103 and thus to provide for a further enlargement of the electrode surface. What is important in the case of HSG silicon layer formation is, in particular, that this layer is formed only in the region of the trench, but not in the region of the insulation collar formed by the insulation layer 106, in order to prevent unreliable constriction of this upper trench section and, furthermore, to ensure that no undesirable leakage current paths occur between the electrodes of the trench capacitor.

In this case, various techniques can be employed for forming an HSG silicon layer in a trench capacitor, it being a common feature of all of the methods that silicon nuclei are formed in a central step of the entire process, which silicon nuclei then grow under suitable process conditions to form silicon grains having a diameter of approximately 10 to 100 nm. One possible method for forming the HSG silicon layer consists in depositing silicon at the transition temperature from amorphous to polycrystalline silicon, as a result of which an HSG silicon layer with silicon grains forms. As an alternative, it is also possible to deposit amorphous, i.e. non-roughened silicon at a temperature distinctly below the transition temperature from amorphous to polycrystalline silicon, in order subsequently to convert the initially smooth amorphous silicon layer into a granular HSG silicon layer by means of a heating step at a temperature above the transition temperature. Furthermore, a nucleation step is suitable for realizing the conversion of the amorphous silicon layer into HSG silicon. A subsequent heat treatment step is optional. With this technique, it is possible to carry out unpatterned HSG silicon production or, alternatively, location-selective HSG silicon production.

In the case of the unpatterned, i.e. non-location-selective HSG method, after the amorphous silicon has been deposited, this layer is nucleated at the transition temperature from amorphous to polycrystalline silicon, as a result of which silicon crystal nuclei are produced from the amorphous silicon. If appropriate, this nucleated silicon layer is then subsequently heated in order to produce enlarged HSG silicon grains. In the case of the location-selective HSG silicon production, the deposited amorphous silicon layer is first patterned by means of a wet- or dry-chemical method in order then subsequently to be nucleated at the transition temperature, so that silicon crystal nuclei are produced. In this case, the process parameters for nucleating the silicon are chosen in such a way that crystal nuclei form only on a silicon support but not e.g. on silicon oxide or silicon nitride. After the nucleation of the silicon layer, subsequent heating can then be effected, if appropriate, in order to enlarge the HSG grains, so that the silicon crystal nuclei grow as a result of the incorporation of unconsumed amorphous silicon.

In accordance with a further method, it is also possible to produce the HSG silicon grains by direct nucleation of polycrystalline silicon at a temperature far above the transition temperature from amorphous to polycrystalline silicon, island growth taking place.

During the production of the HSG silicon layer on the electrode surface of the trench capacitor, it is crucial to ensure that the silicon grains form only in the region of the electrode surface, i.e. in the lower region of the trench in the trench capacitor. Therefore, in the case of non-location-selective HSG silicon layer production in which the silicon grains accumulate on the entire surface of the trench, the silicon grains in the upper region of the trench, which does not serve as a memory region, are subsequently removed or altered by means of suitable methods in such a way that the silicon grains are reconverted again. In order to remove or reconvert the silicon grains, the lower region of the trench with the HSG silicon grains adhering on the surface is covered with the aid of a masking layer, e.g. a photoresist layer or a polysilicon layer, in order to prevent damage. By contrast, in the case of the location-selective HSG production on the basis of an amorphous silicon layer, the patterning is effected before the HSG silicon production.

Various methods for fabricating a trench capacitor with an HSG silicon layer are presented below. These methods are distinguished by simple process sequences which can be integrated into the known standard DRAM processes. Furthermore, all of the presented methods for forming the HSG silicon layer in the trench capacitor also ensure, in particular, reliable removal of HSG silicon grains in the region of the insulation collar or provide for reliable prevention of the production of such grains in the region. The methods explained below are differentiated according to whether the collar insulation of the trench capacitor is implemented before or after the HSG silicon layer production. Furthermore, methods are presented in which the HSG silicon production is carried out in a location-selective manner, and methods are also presented in which the HSG silicon production is not effected in a location-selective manner. In this case, all of the methods presented are implemented in such a way that the HSG production is effected by nucleation of an amorphous silicon layer. As an alternative, however, it is also possible to use all of the other HSG production methods explained above for enlarging the electrode surface in trench capacitors.

FIGS. 1A to 1M show a first method for producing a trench capacitor with an HSG silicon layer, in which the HSG deposition is not effected selectively and the insulation collar layer is implemented in the upper trench region after the HSG silicon production. As is illustrated in FIG. 1A, with a first process step, trenches for the trench capacitors are etched into a p⁻-doped silicon substrate S1. For this purpose, an oxide layer S2 and a nitride layer S3 are produced one after the other on the semiconductor surface. Afterward, with the aid of an additional hard mask, the regions of the trench capacitors are defined and the trenches are then produced with a depth of approximately 1 to 10 μm by means of anisotropic etching.

After the trench etching, an n⁺-doped buried plate is formed. In this case, first of all, as is shown in FIG. 1B, an arsenic glass (ASG) layer S4 is deposited and subsequently, as is illustrated in FIG. 1C, the trenches are filled with polysilicon S5. Then, as is shown in FIG. 1D, this polysilicon layer S5 is etched back to an extent such that the polysilicon filling only remains in the lower region of the trench, which serves as a storage capacitor. Afterward, as is illustrated in FIG. 1E, the arsenic glass S4 is removed above the polysilicon filling S5. A thin nitride layer S6 is then deposited on the wafer surface in order to prevent outdiffusion of arsenic from the arsenic glass layer S4. FIG. 1F shows a cross section through the silicon wafer after this process step. By means of baking, arsenic is then outdiffused from the arsenic glass layer S4 into the silicon substrate S1, with the result that an n⁺-doped layer S7 in the form of a buried plate is formed in the lower region of the trenches, as is shown in FIG. 1G.

Anisotropic nitride etching then ensues in order to remove the nitride layer S6 from the polysilicon surface S5. In order to produce the HSG silicon layer, in a process sequence, the residual polysilicon S5 is then first removed again from the trenches, as is shown in FIG. 1H, and an HSG silicon layer S8 is subsequently produced on the entire wafer surface, it being possible to use essentially all of the abovementioned methods for the HSG production. A cross section through the silicon wafer with the HSG layer is illustrated in FIG. 1I.

In order to ensure doping of the HSG layer with the silicon grains, arsenic can then be back-diffused from the buried plate S7 into the HSG layer S8 by means of a baking step. Such a heating step can also be carried out at a later time in the process.

As an alternative, it is also possible to dope the HSG layer as early as during the production operation or, after the HSG layer production, to perform subsequent doping, e.g. by means of vapor phase doping with arsenic.

Figure 1K:
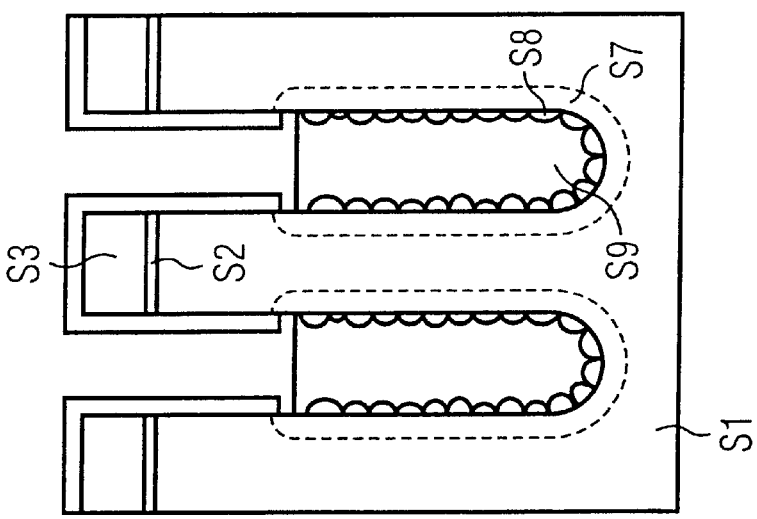

In order to remove the HSG layer S8 from the upper trench region, which does not serve for forming the storage electrodes, a photoresist layer S9 is applied on the silicon wafer, as is shown in FIG. 1J, and is subsequently etched back in such a way that the resist filling S9 remains only in the lower region of the trenches in the region of the buried layer S7. The HSG layer S8 is then removed in the region which is not masked by the resist filling S9. This is accomplished using polysilicon etching, preferably using a dry etching method. A cross section through the silicon wafer after this process step is shown in FIG. 1K.

Figure 1L:
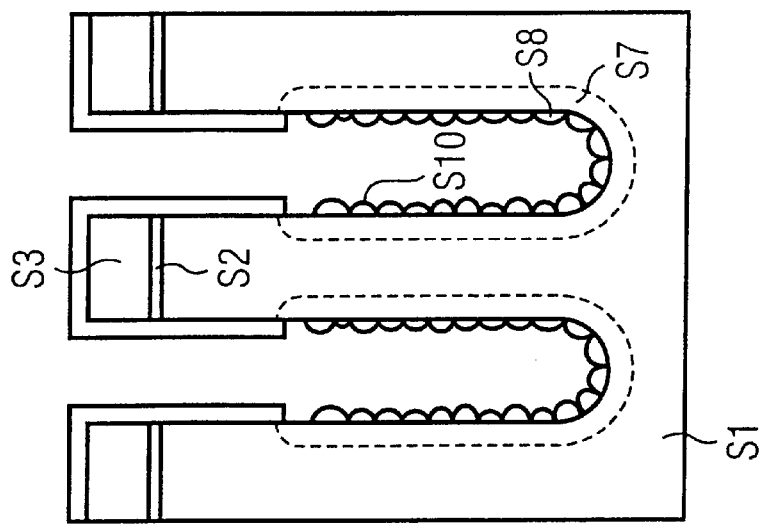
Figure 1O:
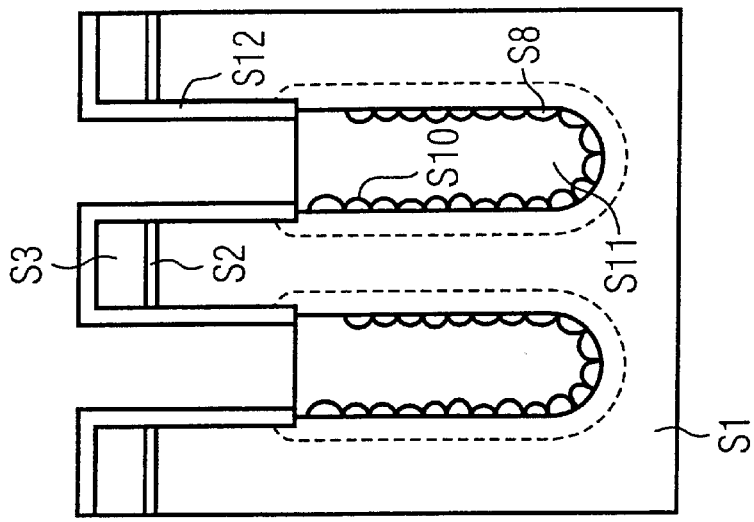
Figure 1N:
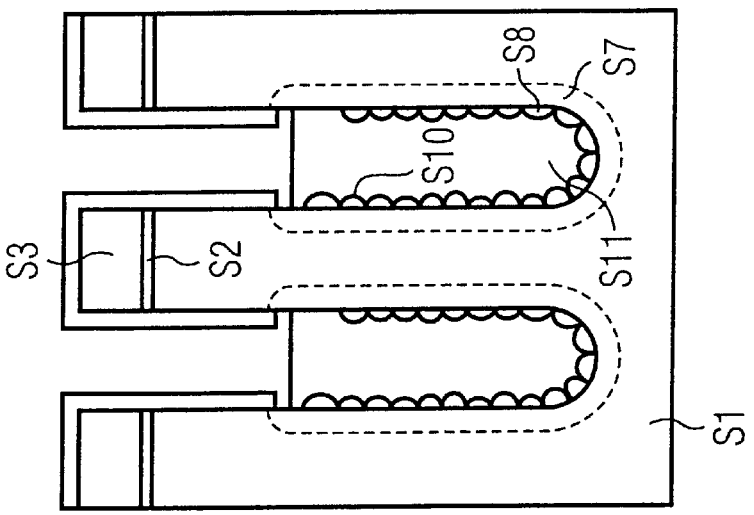
Figure 1M:
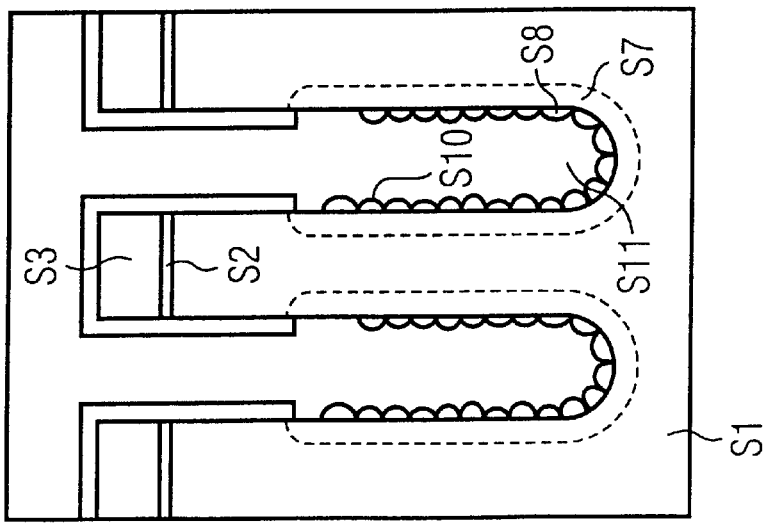

In a further process sequence, the resist filling S9 is then completely removed again from the trenches and a wet-chemical cleaning of the trench surface is carried out. Afterward, the storage dielectric is preferably deposited as an ON (oxide-nitride) layer S10 on the wafer surface, as is shown in FIG. 1L. After the storage dielectric S10 has been deposited, the trenches are filled with n⁺-doped polysilicon S11, as is shown in FIG. 1M, which is subsequently etched back again, as is illustrated in FIG. 1N, as far as the lower edge of the nitride layer S6, which coincides with the upper end of the buried plate S7. In a further etching step, the dielectric layer S10 which is not masked by the polysilicon filling S11 and also the underlying nitride layer S6 are etched away in order subsequently to produce an oxide layer S12 on the side walls of the upper trench region, which oxide layer serves as trench insulation layer for preventing leakage paths between the outer electrode and drain/buried-strap region of the trench capacitor.

The method presented produces, in a simple manner, an HSG layer for enlarging the surface of the electrodes in the trench capacitor and additionally ensures that no silicon grains remain in the upper trench region, which would lead to undesirable leakage currents. The process step shown in FIG. 1o is followed by a polysilicon filling process. The selection transistors are then produced in further process steps. FIGS. 2A to 2Q illustrate a second method according to the invention for fabricating an HSG silicon layer, in the case of which, in a similar manner to the first method, a nonselective HSG deposition is carried out before the insulation collar formation.

Trenches are etched into the silicon substrate S1 in the manner shown in FIG. 2A. These trenches are etched into the oxide layer S2, the nitride layer S3 and into the silicon substrate S1 by means of a lithography step with the aid of a hard mask, and the arsenic glass layer S4 is subsequently deposited, as is shown in FIG. 2B. Then, as is illustrated in FIG. 2C, the trenches are filled with a resist layer S21 which is subsequently etched back, as is illustrated in FIG. 2D, in such a way that only the lower region of the arsenic glass layer S4 remains covered by the resist layer S21. After the removal of the arsenic glass layer S4 in the uncovered upper trench region, as is illustrated in FIG. 2E, the resist layer S21 is completely removed again, as is shown in FIG. 2F, and then an oxide layer S22 is deposited on the wafer surface, as is illustrated in FIG. 2G. This oxide layer S22 serves to prevent outdiffusion of the arsenic from the arsenic glass layer S4.

Figure 2J:
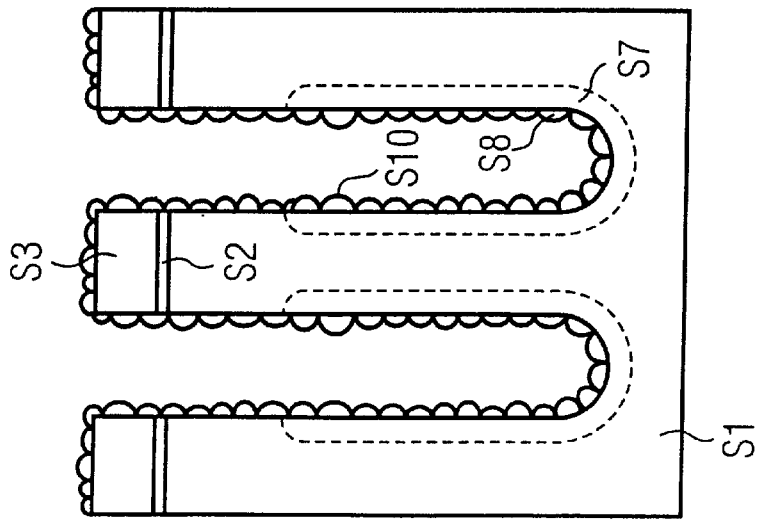
FIGS. 2a–2q show a second embodiment of the method for fabricating a trench capacitor with non-selective HSG silicon production after the formation of the insulation collar.
Figure 2K:
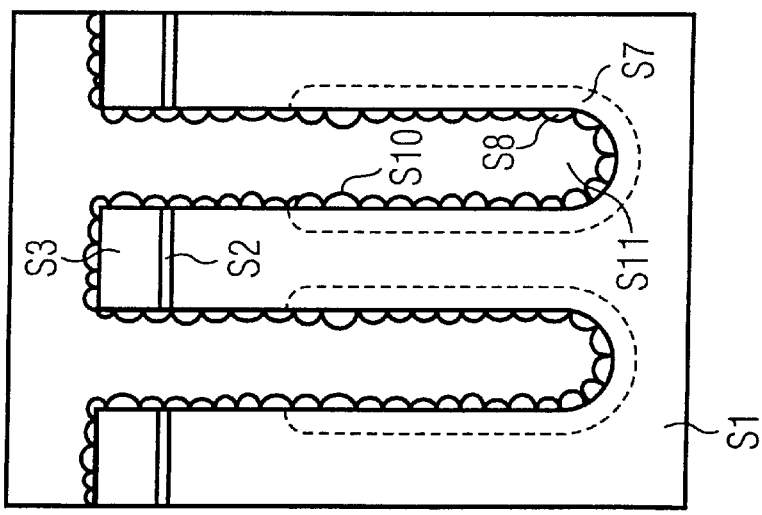
Figure 2L:
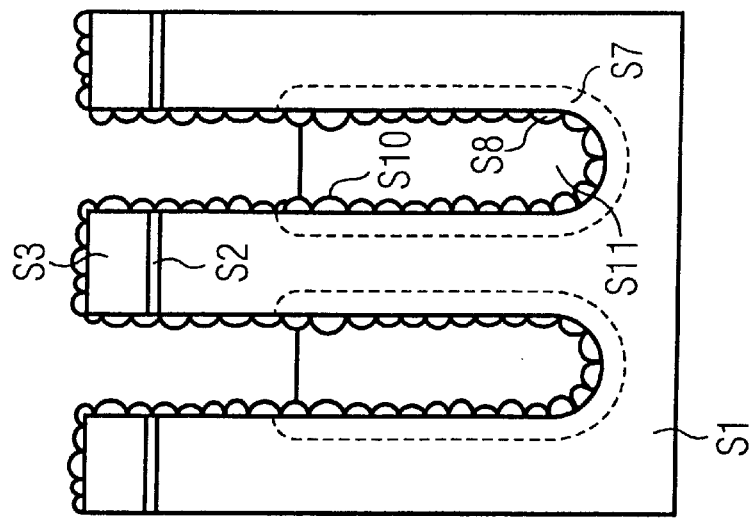

The arsenic is then driven out from the arsenic glass layer S4 into the silicon substrate S1 by means of baking, thereby producing the $n^+$-doped buried plate S7. Afterward, as is illustrated in FIG. 2H, the oxide layer S22 and the remaining arsenic glass S4 are completely removed again in order, as is illustrated in FIG. 2I, to produce the HSG silicon layer S8. In a next process sequence, as is shown in FIGS. 2J and 2K, firstly the storage dielectric S10 is deposited in order subsequently to fill the trenches completely with $n^+$-doped polysilicon S11. The polysilicon layer S11 is then etched back, as is shown in FIG. 2L, as far as the envisaged lower edge of the collar insulation layer, which essentially coincides with the upper edge of the buried plate S7.

Figure 2O:
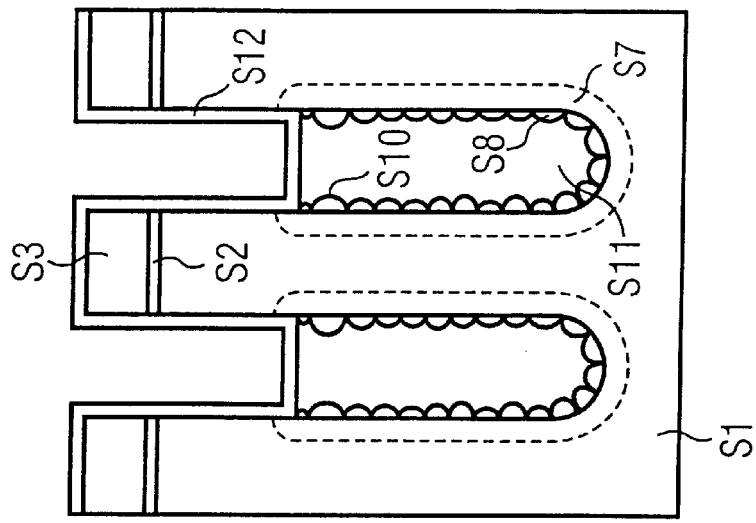
Figure 2N:
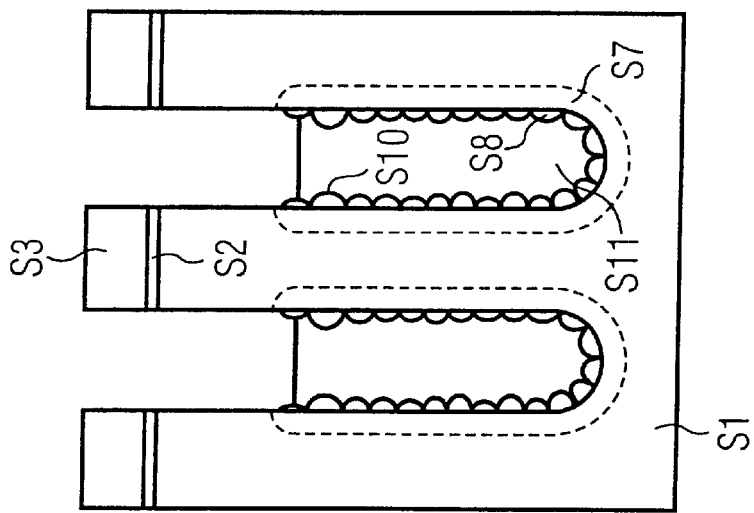
Figure 2M:
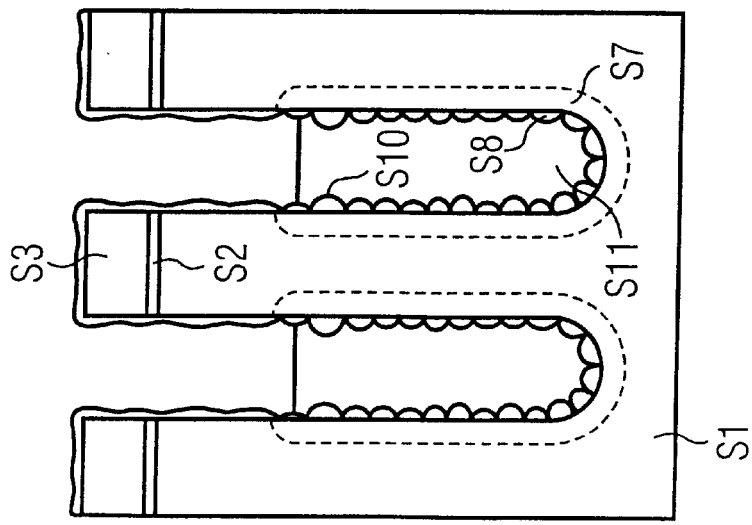

In order subsequently to remove the HSG silicon layer in the uncovered trench region, which is not protected by the polysilicon filling S11, in a first step, planarization of the HSG silicon layer S8 is performed by means of baking, and the silicon grains are reconverted again and a relatively smooth surface is thus produced. As is shown in FIG. 2N, this planarized HSG silicon can then easily be removed by wet-or dry-chemical etching. Afterward, as is shown in FIG. 2o, the oxide layer S12 is then deposited, which serves as a collar insulation layer. As is illustrated in FIG. 2P, this oxide layer S12 is patterned by an etching step in such a way that the oxide layer S12 only remains on the side walls in the upper trench region. Afterward, as is illustrated in FIG. 2Q, the trenches are then completely filled again with $n^+$-doped polysilicon S11 and the selection transistors of the DRAMs are then fabricated in subsequent steps.

The technique—shown in FIGS. 2A to 2Q—for HSG formation on the electrode surface of the trench capacitors reliably ensures that HSG silicon remains only in the region of the electrode surfaces. This is because the planarization of the HSG layer to be removed in the upper trench region of the trench capacitors ensures that this undesired HSG silicon layer can be etched away particularly easily. During the planarization operation, it is crucial that the lower trench region with the HSG layer which serves for enlarging the surface of the electrodes is in this case reliably protected by a temperature-stable layer in order to prevent damage. The silicon grains are preferably planarized with the aid of a high-temperature step at a temperature of approximately 1000° in a predefined atmosphere at a pressure of approximately 70 Torr. Instead of planarization of the HSG silicon layer, as an alternative it is also possible to perform oxidation in order to convert the HSG layer into $SiO_2$ and then to be able to easily remove it.

Figure 3A:
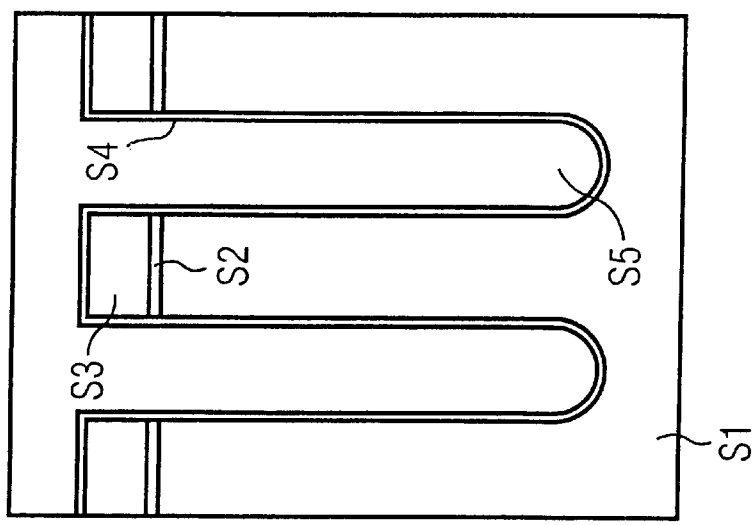
FIGS. 3a–3o show a third embodiment of the method for fabricating a trench capacitor with non-selective HSG silicon production after the formation of the insulation collar.
Figure 3B:
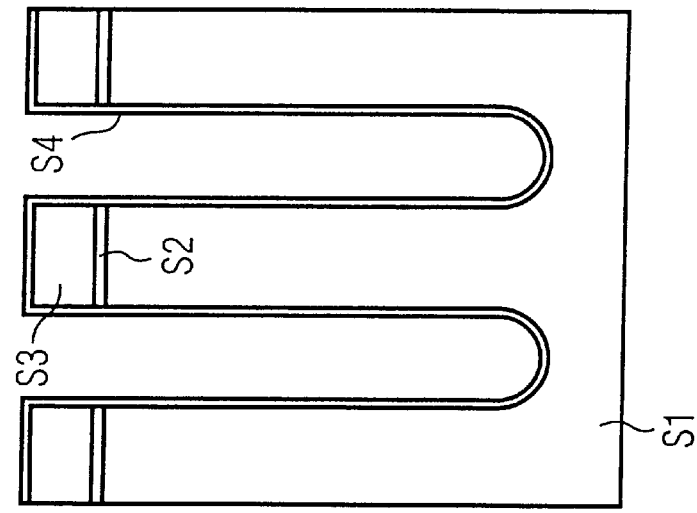
Figure 3C:
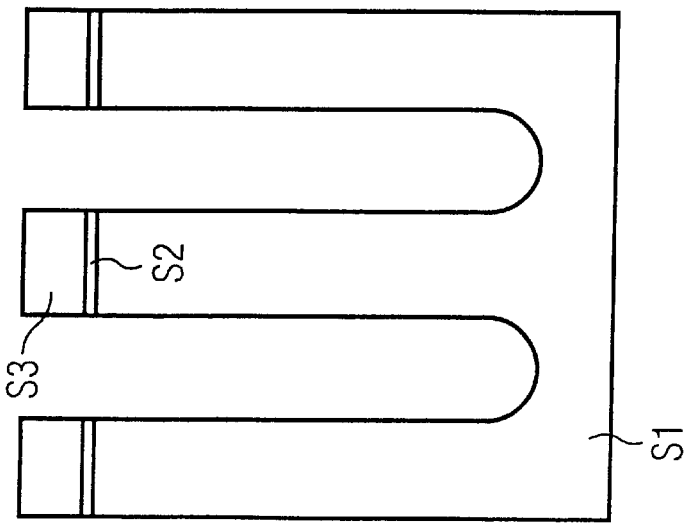
Figure 3D:
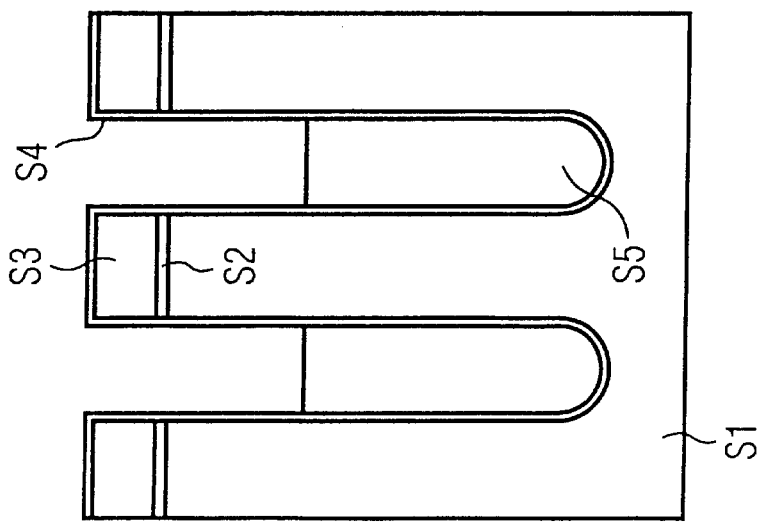
Figure 3E:
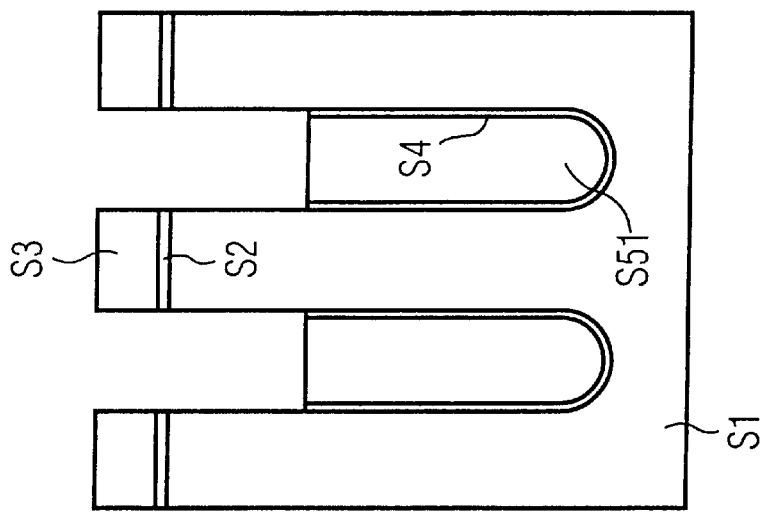

FIGS. 3A to 3O show a further possible method for electrode surface enlargement in a trench capacitor with an HSG layer, in which case the electrode surface is additionally enlarged by trench widening in the lower trench region and, furthermore, the insulation of the collar region is carried out before the HSG silicon formation.

Figure 3F:
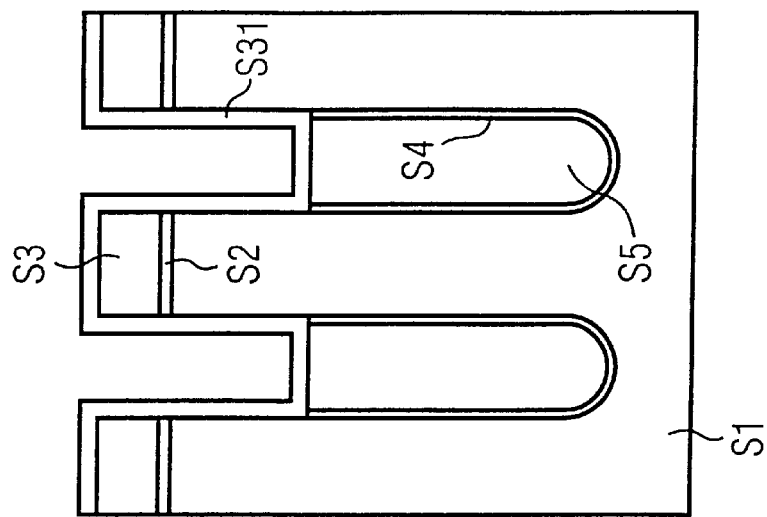

The process sequence shown in FIGS. 3A to 3E corresponds to the process steps shown in FIGS. 1A to 1E. After the removal of the arsenic glass layer S4 in the upper trench region preferably by wet-chemical etching, however, in order to produce the insulation collar before the HSG layer production, an oxide layer S31 is deposited on the wafer surface, as is shown in FIG. 3F. Afterward, the arsenic is driven out from the arsenic glass layer S4 into the surrounding silicon substrate S1 by means of a high-temperature step, in order to produce the $n^+$-doped buried plate S7 here. The oxide layer S31, which prevents outdiffusion of the arsenic from the arsenic glass layer S4 during the baking step, is then etched back in such a way that it only remains as a spacer structure on the side walls in the upper trench region. A cross section through the semiconductor structure after this process step is illustrated in FIG. 3G.

Afterward, the polysilicon layer S5, which served as masking of the lower trench region for the purpose of forming the collar oxide layer S31, and also the remaining arsenic glass S4 are then removed again, as is illustrated in FIG. 3H. Then, as is shown in FIG. 3I, the lower trench region is enlarged for the purpose of enlarging the surface of the electrodes by means of an etching operation. In a next process sequence, an HSG silicon layer S8 is then produced over the entire surface of the wafer, as is illustrated in FIG. 3J.

As is shown in FIG. 3K, this HSG silicon layer S8 is masked in the lower trench region below the collar oxide layer S31. The trenches are first completely filled with a photoresist layer S32, which is then etched back as far as the lower edge of the collar oxide layer S31. Afterward, the HSG silicon layer S8 is then removed again in the region not marked by the resist filling S32. In this case, it is also possible to use the technique of planarization and subsequent removal of the HSG layer as explained in connection with FIGS. 2A to 2Q. However, instead of the resist filling, it is then necessary to use e.g. a polysilicon filling. Moreover, the HSG silicon must, if appropriate, be superficially passivated beforehand.

After this process step, which is shown in FIG. 3L, in a process sequence illustrated in FIGS. 3M to 3o, the resist filling S32 is then removed again from the trenches, and the wafer surface is subsequently cleaned, in particular also in the region of the HSG silicon S8, in order then to perform an NO deposition S10 for producing the storage dielectric. In order to produce the inner electrode in trench capacitors, the trenches are furthermore filled with $n^+$-doped polysilicon S11.

Figure 4I:
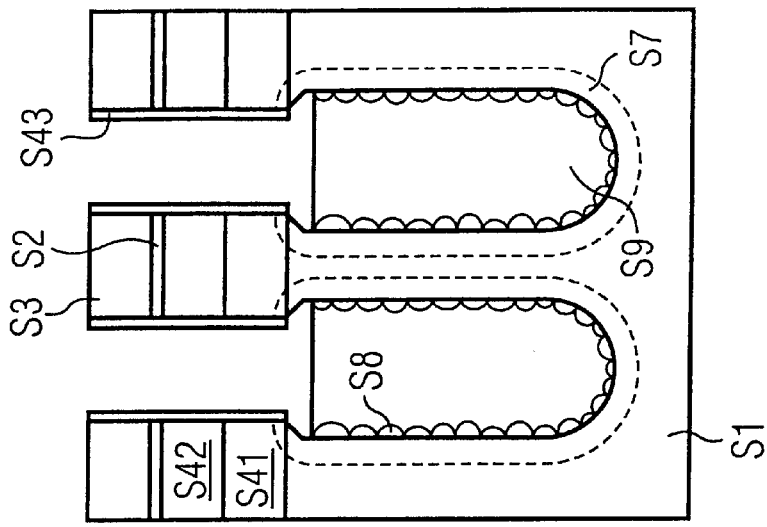
Figure 4H:
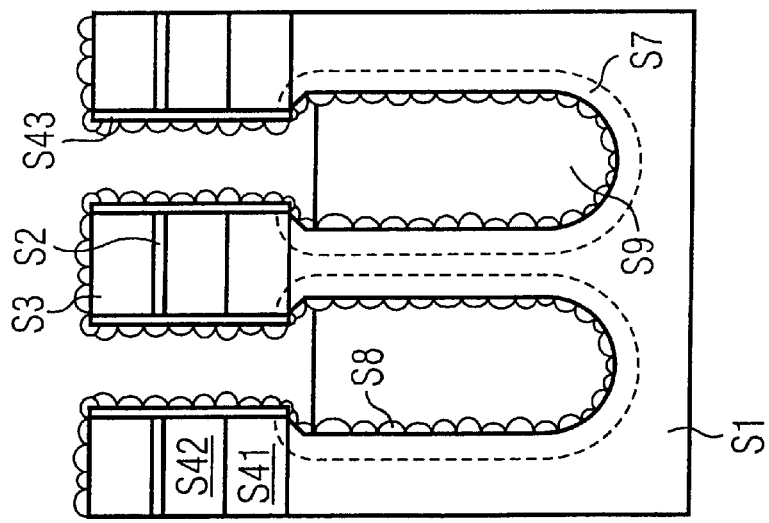

FIGS. 4A to 4O show a fourth process sequence according to the invention, in which a trench capacitor with an HSG silicon layer is fabricated on an SOI (silicon-on-insulator) substrate using non-selective deposition technology.

As shown in FIG. 4A, the trenches are etched into a wafer surface in the case of which a layer sequence including an oxide layer S41 and a silicon layer S42 is arranged on the silicon substrate S1. A thin oxide layer S2 and the nitride layer S3 once again cover the surface. The trench etching is effected with the aid of an additional hard mask (not represented here). The upper trench region in which the collar insulation layer is formed is additionally protected by a thin nitride layer S43.

In further process steps, as is illustrated in FIGS. 4B to 4D, first the arsenic glass layer S4 is deposited on the wafer surface and the trenches are then filled with the polysilicon layer S5. Afterward, in order to form the buried plate S7, arsenic is driven out into the surrounding silicon substrate S1 by means of a high-temperature step. In this case, the thin nitride layer S43 serves as masking for preventing arsenic doping in the upper trench region. A cross section through the wafer surface after this process step is shown in FIG. 4D.

Figure 4G:
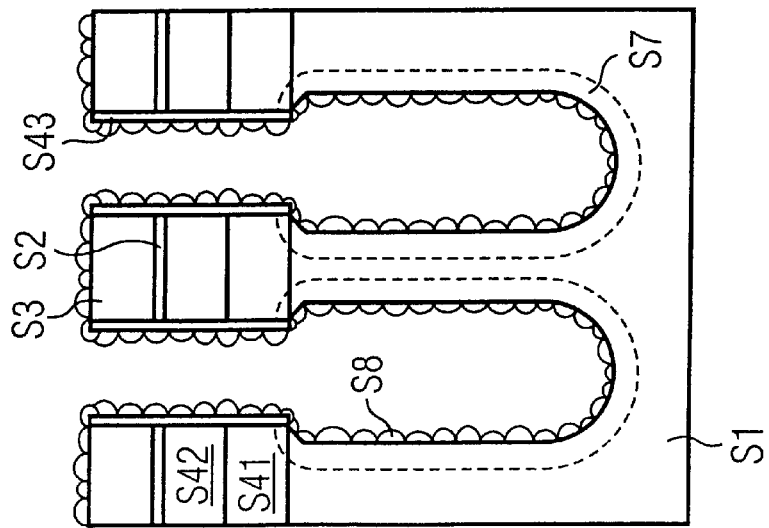
Figure 4M:
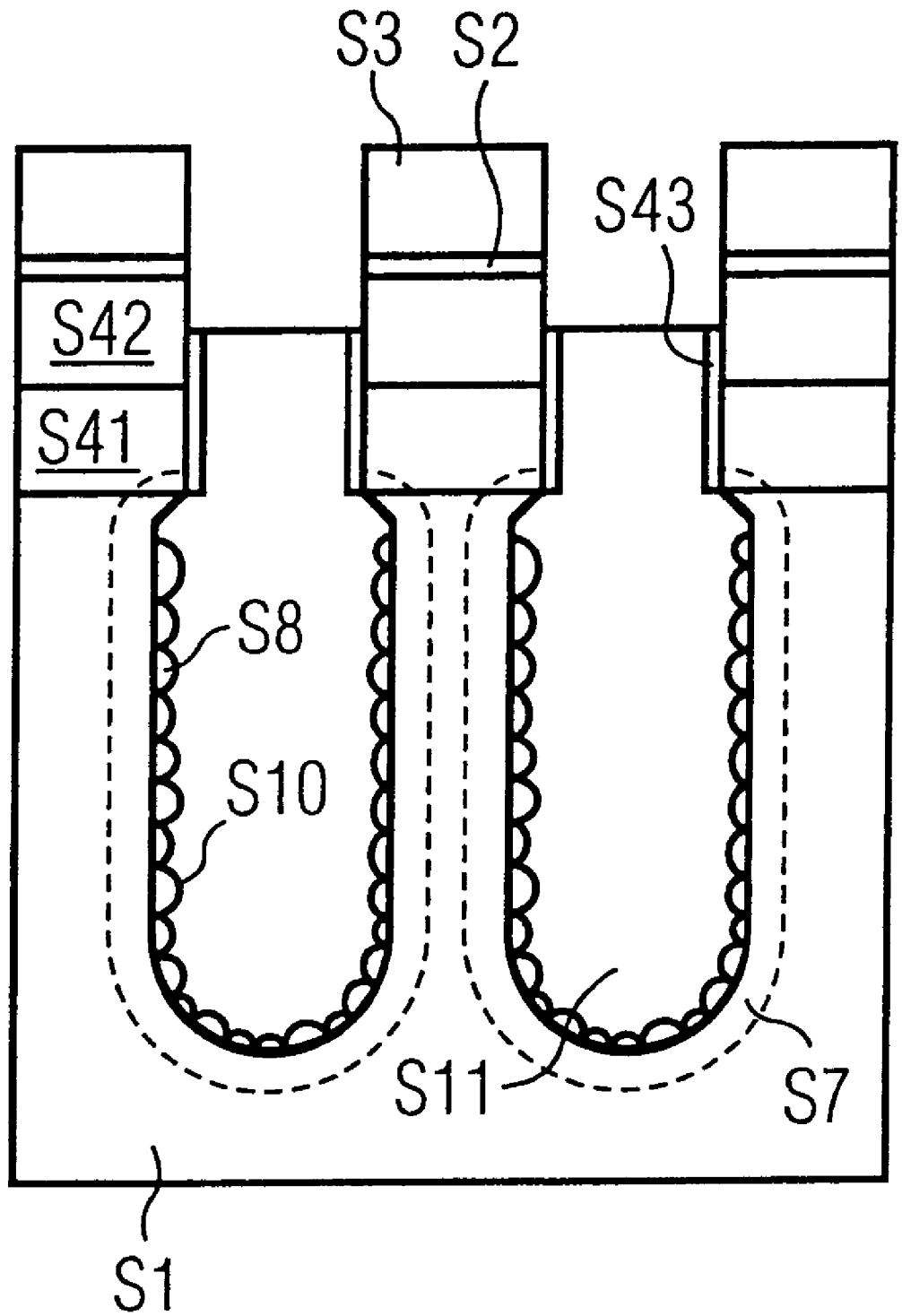

Afterward, as is illustrated in FIG. 4E, the polysilicon layer S5 is completely removed again from the trenches in order then to widen the lower trench region below the nitride layer S43 preferably by means of wet-chemical etching, as is illustrated in FIG. 4F. In further process steps, the nonselective HSG silicon deposition S8 on the entire wafer surface is performed, as is illustrated in FIG. 4G, in order subsequently to fill the trenches with the resist layer S9, which is then etched back below the edge of the oxide layer S41 which defines the insulation collar. The uncovered HSG silicon layer S8 is subsequently removed.

After the subsequent removal of the resist filling S9 from the trenches, the NO layer is deposited as a storage dielectric S10 on the wafer surface, as is illustrated in FIG. 4J, and the trenches are then filled with $n^+$-doped polysilicon S11, which serves as the inner electrode. This polysilicon layer S11 is etched back to a point below the oxide layer S2 and the nitride layer S3 and the uncovered storage dielectric S10 and the underlying nitride layer S43 are subsequently removed from the side walls of the trench. The function of the collar oxide from the previous exemplary embodiment is in this case formed by the buried oxide layer S41.

Until now, the presented methods for fabricating the HSG silicon layer for enlarging the electrode surface in the trench capacitor have always involved the use of a nonselective deposition technique in which subsequent removal of the HSG layer in the insulation collar region is performed.

Figure 5F:
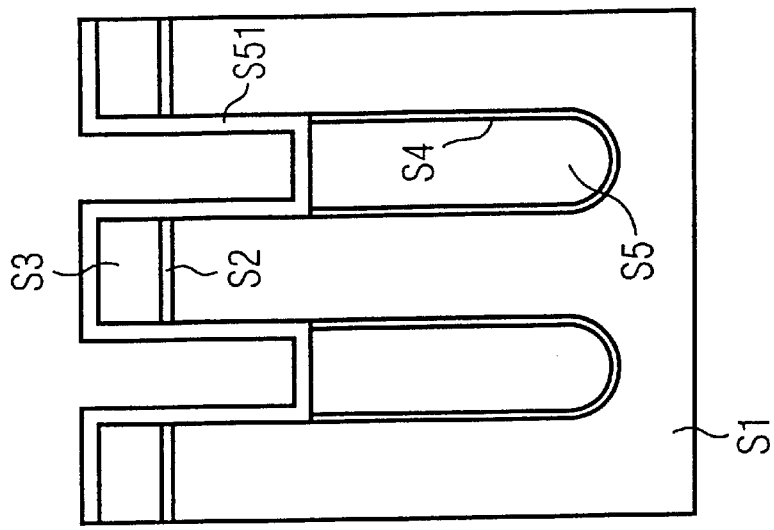
FIGS. 5a–5o show a fifth embodiment of the method for fabricating a trench capacitor with selective HSG silicon production after the formation of an insulation collar.
Figure 5E:
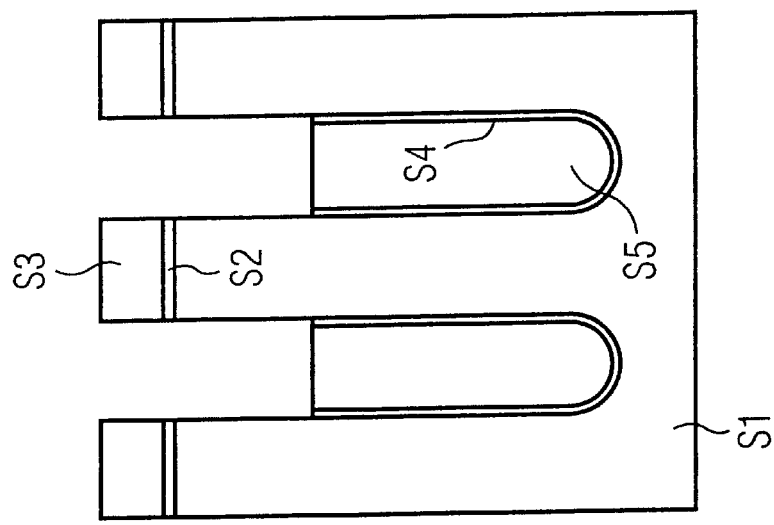
Figure 5D:
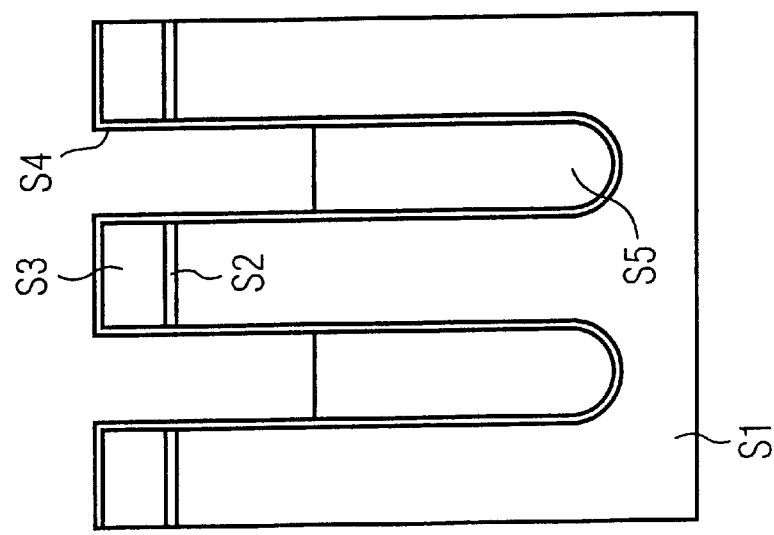
Figure 5J:
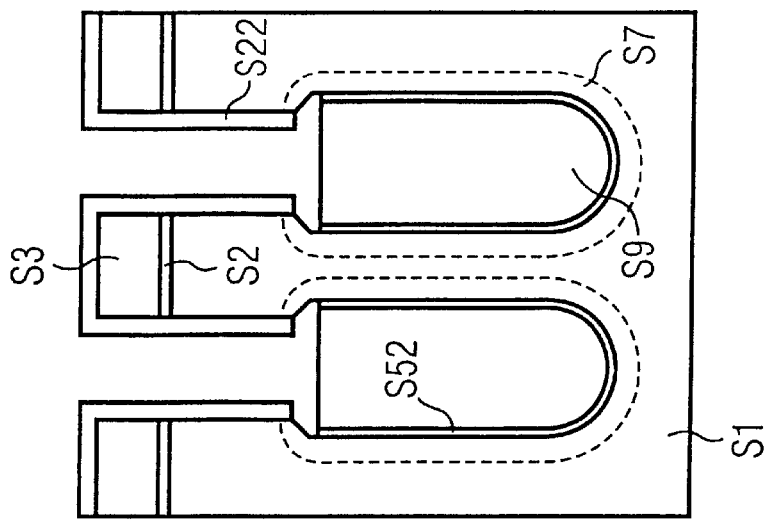
Figure 5K:
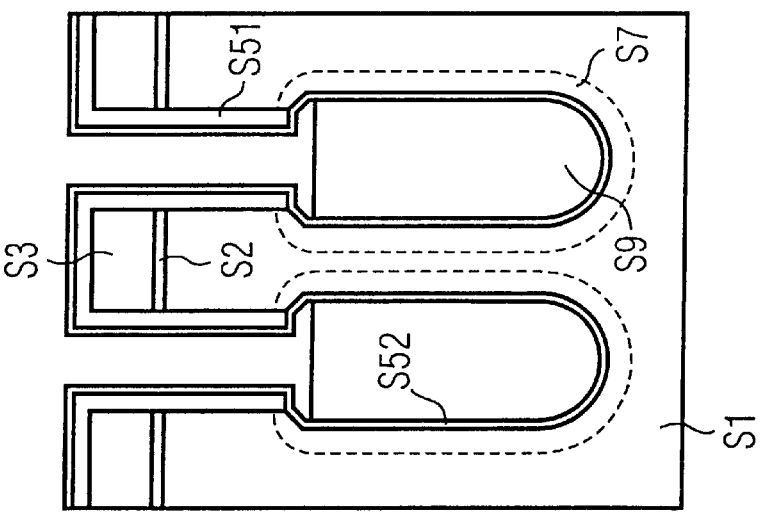
Figure 5L:
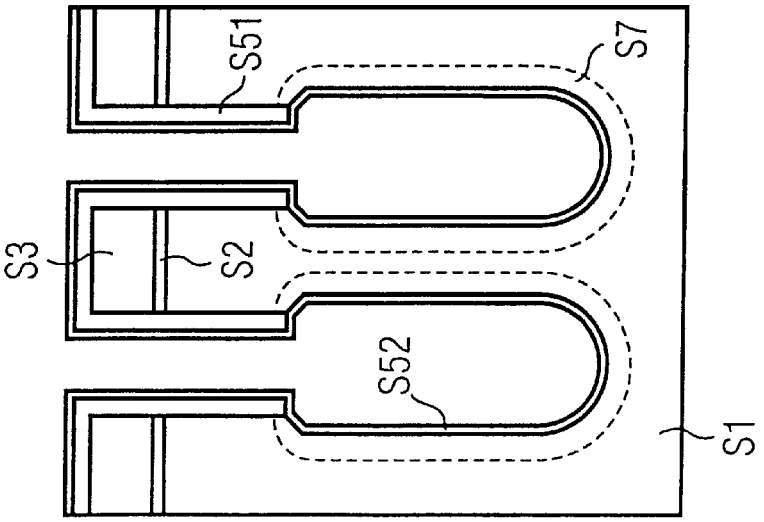
Figure 5O:
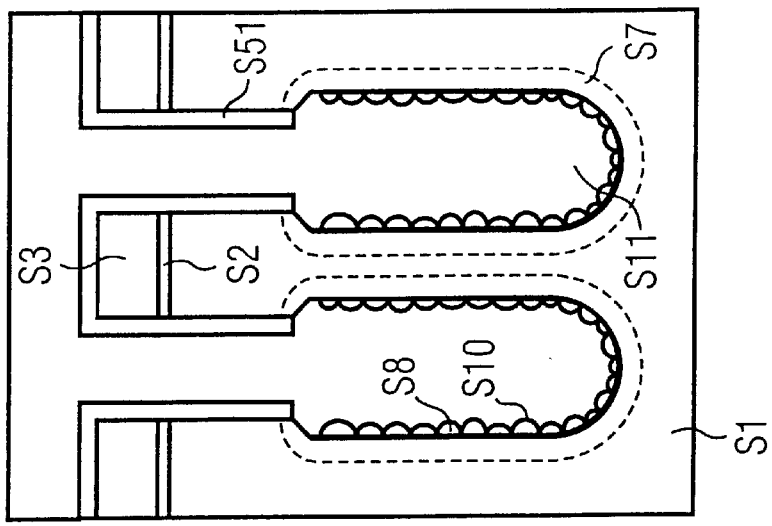

FIGS. 5A to 5O show a fifth embodiment, in which location-selective HSG production is performed in the lower trench region. However, the method presented below can, in principle, also be applied to all of the abovementioned exemplary embodiments of trench capacitors. The process sequence presented essentially follows the process sequence presented in connection with the second exemplary embodiment.

The trench etching shown in FIG. 5A is followed by the arsenic glass deposition S4 and then the trenches are filled with the polysilicon layer S5. This polysilicon layer S5 is then removed again from the upper region of the trenches, in which the collar insulation is intended to be formed. Afterward, the arsenic glass S4 is also etched away in this region, preferably by wet-chemical etching. This process sequence is shown in FIGS. 5A to 5E.

As is illustrated in FIGS. 5F and 5G, an oxide layer S51 is then deposited on the wafer surface and arsenic is subsequently driven out from the arsenic glass layer S4 into the surrounding silicon substrate S1, in order to form the buried plate S7. Then, as is illustrated in FIG. 5G, the oxide layer S51 is patterned by etching in such a way that it remains only on the side walls of the trench. After the subsequent removal of the residual polysilicon filling S5 in the trenches and the etching-away of the remaining arsenic glass layer S4, the lower trench region is widened by means of a further etching step in order to enlarge the electrode surface, as is illustrated in FIG. 5I.

A thin amorphous silicon layer S52 is then deposited on the entire wafer surface, in particular also in the trench region, as is illustrated in FIG. 5J. The trenches are subsequently filled with the photoresist layer S9, which, in a further step, is then etched back to a point below the collar oxide layer S51. The resist filling S9 serves for masking the amorphous silicon layer S52 in the lower trench region during the etching of the collar oxide layer S51, in order to prevent damage. The amorphous silicon layer S52 is then removed again in the uncovered upper region by means of wet- or dry-chemical etching and the resist filling S9 is subsequently etched out from the trenches, so that the trenches are completely uncovered again.

Figure 5N:
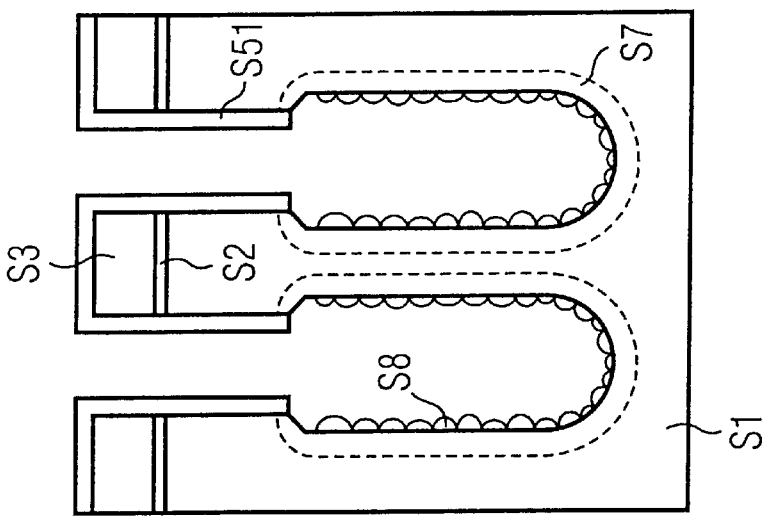
Figure 5M:
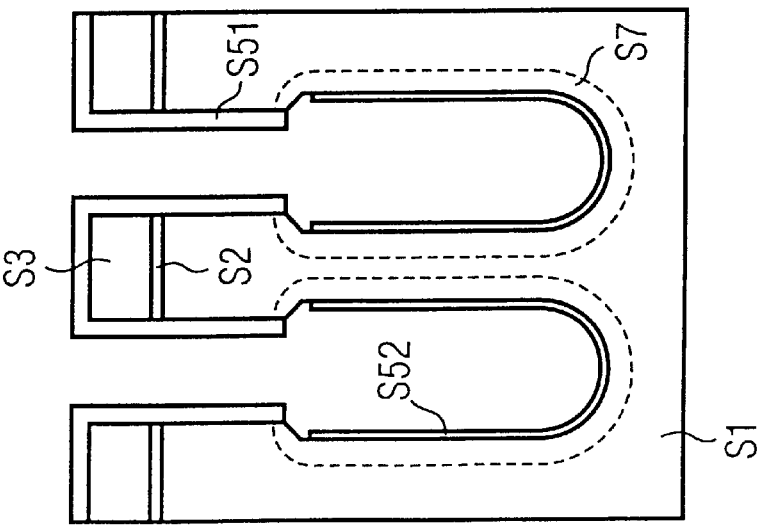

After cleaning of the wafer surface, in particular also in the lower trench region, the residual amorphous silicon area S52 is nucleated in a location-selective manner at the transition temperature from amorphous to crystalline silicon, so that silicon crystal nuclei are produced. If necessary, the nucleated silicon layer can be converted still further into the HSG silicon layer S8 in a subsequent heat-treatment step. A cross section through the wafer surface after this process step is shown in FIG. 5N. The selective character of the HSG formation is clearly discernible. HSG is formed only in the region in which the amorphous SI layer was previously situated. In a further process step sequence, the storage dielectric S10 is then deposited and the trenches are filled with $n^+$-doped polysilicon S11 in order to produce the inner electrode.

The presented techniques for forming trench capacitors in DRAM fabrication processes make it possible, by means of a roughened silicon surface on at least one of the capacitor surfaces, to significantly increase the capacitance of the trench capacitor and, at the same time, to ensure that the roughened silicon actually remains only on the electrode surface within the trench capacitor, but not in the insulation collar region. The methods presented are not at all restricted to a DRAM fabrication process, but rather can be used in all semiconductor devices with trench capacitors.

Furthermore, it lies within the scope of the invention over and above the abovementioned exemplary embodiments to modify the specified dimensions, concentrations, materials and processes in a suitable manner in order to fabricate the invention's trench capacitor with HSG silicon layer. In particular, it is possible to have recourse here to all known process sequences for forming trench capacitors in particular in the context of DRAM fabrication processes. Furthermore, the conductivity type of the doped regions in the semiconductor structure can be embodied in a complementary fashion. Furthermore, the specified materials for forming the various layers can be replaced by other materials known in this connection. In particular, for forming the storage layer, other known dielectrics having a high dielectric constant can also be used instead of an ON layer. Furthermore, in addition to the semiconductor layers presented, further layer sequences can be introduced into the semiconductor structure, e.g. for the purpose of forming barriers in order to prevent undesired diffusions. Moreover, the selectivities and masked sequences in the structure processes presented can be modified in a suitable way without departing from the scope of the invention. Instead of the HSG silicon, it is also possible to use HSG—$Si_xGe_{1-x}$, for example.

The features of the invention which are disclosed in the above description, the drawings and the claims may be of importance both individually and in any desired combination for the realization of the invention in its various configurations.

We claim:

1. A method for fabricating a trench capacitor, which comprises:
   providing a silicon substrate;
   forming a trench, having a lower region and a surface, in the silicon substrate;
   forming a doped layer in the silicon substrate in the lower region of the trench;
   producing a roughened silicon layer, having silicon grains with a diameter ranging from essentially 10 to 100 nm, in the lower region of the trench by:

depositing an amorphous silicon layer on all of the surface of the trench, patterning the amorphous silicon layer by etching such that the amorphous silicon layer is limited to the lower region of the trench, and subsequently nucleating the amorphous silicon layer to form the silicon grains;

applying a dielectric intermediate layer on the roughened silicon layer; and filling the trench with a doped layer.

2. The method according to claim 1, which comprises performing the step of producing the roughened silicon layer by:

depositing essentially smooth amorphous silicon at a temperature below the transition temperature from amorphous silicon to polycrystalline silicon; and subsequently converting the essentially smooth silicon layer into the roughened silicon layer by performing a heating step at a temperature selected from the group consisting of a temperature close to the transition temperature and a temperature above the transition temperature.

3. The method according to claim 1, which comprises, before producing the roughened silicon layer, forming an insulation layer in an upper region of the trench.

4. The method according to claim 3, which comprises performing the nucleating step by selectively nucleating the amorphous silicon layer in the lower region of the trench to form the silicon grains.

5. The method according to claim 1, which comprises, after producing the roughened silicon layer, forming an insulation layer in an upper region of the trench.

6. The method according to claim 1, which comprises using the trench capacitor to form a semiconductor memory cell.

7. A method for fabricating a trench capacitor, which comprises:

providing a silicon substrate;

forming a trench, having a lower region and a surface, in the silicon substrate;

forming a doped layer in the silicon substrate in the lower region of the trench;

producing a roughened silicon layer, having silicon grains with a diameter ranging from essentially 10 to 100 nm, in the lower region of the trench by:

producing the roughened silicon layer on all of the surface of the trench, masking the lower region of the trench, and using an etching method to remove the roughened silicon layer from an upper region of the trench;

applying a dielectric intermediate layer on the roughened silicon layer; and filling the trench with a doped layer.

8. The method according to claim 7, which comprises, before performing the etching method to remove the roughened silicon layer, planarizing the roughened silicon layer in the upper region of the trench.

9. The method according to claim 8, which comprises performing the planarizing step using a high-temperature step in which the roughened silicon layer in the lower region of the trench is masked by a temperature-stable layer.

10. The method according to claim 7, which comprises performing the step of producing the roughened silicon layer by depositing silicon at a transition temperature between amorphous silicon and polycrystalline silicon.

11. The method according to claim 1, which comprises performing the step of producing the roughened silicon layer by:

depositing an essentially smooth amorphous silicon at a temperature below a transition temperature between amorphous silicon and polycrystalline silicon; and subsequently converting the essentially smooth silicon layer into the roughened silicon layer by performing a heating step at a temperature selected from the group consisting of a temperature close to the transition temperature and a temperature above the transition temperature.

12. The method according to claim 7 which comprises, before producing the roughened silicon layer, forming an insulation layer in an upper region of the trench.

13. The method according to claim 12, which comprises performing the nucleating step by selectively nucleating the amorphous silicon layer in the lower region of the trench to form the silicon grains.

14. The method according to claim 7, which comprises, after producing the roughened silicon layer, forming an insulation layer in an upper region of the trench.

15. The method according to claim 7, which comprises using the trench capacitor to form a semiconductor memory cell.

* * * * *